US009122116B2

(12) United States Patent
Fujikawa

(10) Patent No.: US 9,122,116 B2
(45) Date of Patent: Sep. 1, 2015

(54) ACTIVE MATRIX SUBSTRATE AND DISPLAY PANEL INCLUDING THE SAME

(75) Inventor: Yohsuke Fujikawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 87 days.

(21) Appl. No.: 14/130,510

(22) PCT Filed: Jul. 13, 2012

(86) PCT No.: PCT/JP2012/004546
§ 371 (c)(1),
(2), (4) Date: Jan. 2, 2014

(87) PCT Pub. No.: WO2013/011678
PCT Pub. Date: Jan. 24, 2013

(65) Prior Publication Data
US 2014/0146257 A1    May 29, 2014

(30) Foreign Application Priority Data
Jul. 20, 2011  (JP) .................................. 2011-159304

(51) Int. Cl.
G02F 1/1343    (2006.01)
G02F 1/1362    (2006.01)
G02F 1/1345    (2006.01)
H01L 27/32    (2006.01)

(52) U.S. Cl.
CPC ........ *G02F 1/136286* (2013.01); *G02F 1/1345* (2013.01); *G02F 2001/13629* (2013.01); *H01L 27/3276* (2013.01)

(58) Field of Classification Search
CPC ............ G02F 1/1345; G02F 1/136286; H01L 27/3276
USPC .................. 349/139, 147, 148, 149, 150, 151
See application file for complete search history.

(56) References Cited

U.S. PATENT DOCUMENTS

| 5,499,131 | A | * | 3/1996 | Kim ................................ 349/149 |
| 5,757,450 | A | * | 5/1998 | Fujii et al. ..................... 349/106 |
| 6,683,669 | B1 | * | 1/2004 | Fujikawa ........................ 349/149 |
| 2002/0060833 | A1 | * | 5/2002 | Yamaguchi ................... 359/245 |
| 2002/0135293 | A1 |   | 9/2002 | Aruga |
| 2007/0290603 | A1 | * | 12/2007 | Ishizuka et al. ............... 313/498 |
| 2012/0235713 | A1 | * | 9/2012 | Mori .............................. 327/109 |

FOREIGN PATENT DOCUMENTS

| JP | 10-339880 A | 12/1998 |
| JP | 2008-046188 A | 2/2008 |
| WO | 02/065434 A1 | 8/2002 |

OTHER PUBLICATIONS

Official Communication issued in International Patent Application No. PCT/JP2012/004546, mailed on Oct. 16, 2012.

* cited by examiner

*Primary Examiner* — Sang V Nguyen
(74) *Attorney, Agent, or Firm* — Keating & Bennett, LLP

(57) ABSTRACT

An active matrix substrate includes: a display region; a non-display region around the display region; a mounting region of the non-display region; a plurality of first signal lines provided in the non-display region to extend from near the display region to the mounting region, partially spaced at a pitch Pa, partially spaced at a pitch Pb, and partially inclined at an angle θa; and a plurality of second signal lines provided in the non-display region to extend from near the display region to the mounting region, partially spaced at the pitch Pa, partially spaced at the pitch Pb, partially inclined at the angle θa, and partially inclined at an angle θb. The pitch Pd between each adjacent pair of a plurality of second connectors of the second signal lines is greater than the pitch Pc between each adjacent pair of a plurality of first connectors of the first connectors.

11 Claims, 17 Drawing Sheets

ACTIVE MATRIX SUBSTRATE AND DISPLAY PANEL INCLUDING THE SAME

TECHNICAL FIELD

The present disclosure relates to active matrix substrates and display panels including the same, and more particularly relates to an active matrix substrate having a non-display region where a signal line changes from a first wiring layer to a second wiring layer, and a display panel including the same.

BACKGROUND ART

A liquid crystal display panel includes, for example, an active matrix substrate and a counter substrate facing each other, and a liquid crystal layer provided between the active matrix substrate and the counter substrate. The liquid crystal display panel has a display region for displaying an image, and a non-display region defined outside the display region.

A portion of the active matrix substrate corresponding to the display region includes a plurality of gate signal lines extending in parallel, and a plurality of source signal lines extending in parallel in a direction that intersects the gate signal lines.

A plurality of signal lines, such as the gate signal lines and the source signal lines, extend in parallel in the display region as described above, subsequently extend side-by-side in the non-display region, and further extend to a substrate end portion of the non-display region, i.e., a terminal region of the active matrix substrate protruding beyond the counter substrate, so as to be connected to a drive circuit.

In order to retard corrosion of portions of the signal lines corresponding to the terminal region, a line structure has been proposed which includes, for example, a first wiring layer located in the display region and made of an electrically low resistance material, such as aluminum, a second wiring layer located in the non-display region and made of a high melting point material, such as tantalum or tungsten, and a connector located in the non-display region and configured to change the line structure from the first wiring layer to the second wiring layer. In other words, the line structure in which the first and second wiring layers made of different materials are connected together has been proposed (see, e.g., PATENT DOCUMENTS 1-3).

Specifically, PATENT DOCUMENT 1 describes an electronic device including a first electrode, a second electrode intersecting the first electrode, a first routing line connected to the first electrode, and a second routing line connected to the second electrode, wherein a lower voltage than the voltage applied to the first routing line is applied to the second routing line, the second routing line includes a metal film, and the first routing line does not include a metal film.

CITATION LIST

Patent Documents

PATENT DOCUMENT 1: Japanese Unexamined Patent Publication No. 2008-46188
PATENT DOCUMENT 2: Japanese Unexamined Patent Publication No. H10-339880
PATENT DOCUMENT 3: International Patent Publication No. WO02/065434

SUMMARY OF THE INVENTION

Technical Problem

Incidentally, an active matrix substrate includes a plurality of signal lines extending to a terminal region of the active material substrate as described above so as to be concentrated toward a portion of the terminal region including a drive circuit, and portions of the signal lines in the non-display region are, therefore, concentrated such that a portion of a group of the signal lines in the non-display region has a generally fan-shaped outline. However, if the non-display region includes connectors provided somewhere along the signal lines and configured to change the signal lines from first wiring layers to second wiring layers as described above, the degree of concentration of the signal lines is physically reduced, and consequently, the area where the signal lines are routed increases.

It is therefore an object of the present disclosure to reduce the increase in the area where a plurality of signal lines are routed even when a non-display region includes connectors provided somewhere along the signal lines and configured to change the signal lines from first wiring layers to second wiring layers.

Solution to the Problem

In order to achieve the object, according to the present disclosure, in a non-display region, the pitch between each adjacent pair of a plurality of second connectors provided in a one-to-one correspondence with a plurality of second signal lines is greater than the pitch between each adjacent pair of a plurality of first connectors provided in a one-to-one correspondence with a plurality of first signal lines.

Specifically, an active matrix substrate according to the present disclosure includes: a rectangular display region configured to display an image; a non-display region defined around the rectangular display region; a mounting region defined in a portion of the non-display region along an edge of the display region; a plurality of first signal lines provided in the non-display region to extend in parallel from near the display region in a direction orthogonal to the edge of the display region while being spaced at a pitch $P_a$, then extend in parallel in a direction that intersects the edge of the display region at an angle $\theta_a$, and further extend to the mounting region in parallel in the direction orthogonal to the edge of the display region while being spaced at a pitch $P_b$; a plurality of second signal lines provided in the non-display region to be adjacent to the first signal lines in a reference direction of the angle $\theta_a$, extend in parallel from near the display region in the direction orthogonal to the edge of the display region while being spaced at the pitch $P_a$, then extend in parallel in the direction that intersects the edge of the display region at the angle $\theta_a$, subsequently extend in parallel in the direction orthogonal to the edge of the display region, further extend in parallel in a direction that intersects the edge of the display region at an angle $\theta_b$, and finally extend to the mounting region in parallel in the direction orthogonal to the edge of the display region while being spaced at the pitch $P_b$; a plurality of first wiring layers forming portions of the first and second signal lines near the display region; a plurality of second wiring layers that form portions of the first and second signal lines near the mounting region, are formed in a layer different from a layer including the first wiring layers, and are made of a material different from that of the first wiring layers; a plurality of first connectors that are provided in the non-display region so as to be spaced at a pitch $P_c$, and are included in the first signal lines to connect corresponding ones of the first wiring layers to corresponding ones of the second wiring layers along the direction orthogonal to the edge of the display region; and a plurality of second connectors that are provided in the non-display region to be adjacent to the first connectors and so as to be spaced at a pitch $P_d$ greater than the pitch $P_c$, and are included in the second signal lines to connect corresponding ones of the first wiring layers to corresponding ones of the second wiring layers along the direction orthogonal to the edge of the display region.

With the configuration, portions of the first signal lines in the non-display region extend in parallel from near the display region in the direction orthogonal to the edge of the display region while being spaced at the pitch $P_a$, then extend in parallel in the direction that intersects the edge of the display region at the angle $\theta_a$, and further extend to the mounting region in parallel in the direction orthogonal to the edge of the display region while being spaced at the pitch $P_b$. Portions of the second signal lines in the non-display region are adjacent to the first signal lines in the reference direction of the angle $\theta_a$, extend in parallel from near the display region in the direction orthogonal to the edge of the display region while being spaced at the pitch $P_a$, then extend in parallel in the direction that intersects the edge of the display region at the angle $\theta_a$, subsequently extend in parallel in the direction orthogonal to the edge of the display region, further extend in parallel in the direction that intersects the edge of the display region at the angle $\theta_b$, and finally extend to the mounting region in parallel in the direction orthogonal to the edge of the display region while being spaced at the pitch $P_b$. The first connectors are each included in a corresponding one of the first signal lines to connect the first wiring layers to the second wiring layers along the direction orthogonal to the edge of the display region. The second connectors are each included in a corresponding one of the second signal lines to connect the first wiring layers to the second wiring layers along the direction orthogonal to the edge of the display region. The pitch $P_d$ between each adjacent pair of the second connectors is greater than the pitch $P_c$ between each adjacent pair of the first connectors. Here, increasing the pitch $P_d$ can reduce the angle $\theta_b$, based on the relational expression $\sin \theta_b = P_g/P_d$, where $P_g$ (see FIG. 5) represents the pitch between each adjacent pair of portions of the side-by-side second signal lines extending in parallel in the direction that intersects the edge of the display region at the angle $\theta_b$. Since the pitch $P_d$ between each adjacent pair of the second connectors is, therefore, greater than the pitch $P_c$ between each adjacent pair of the first connectors, this can increase the degree of concentration of the second signal lines. This can reduce the increase in area where a group including the first and second signal lines is routed, and therefore, even if the non-display region includes the connectors provided somewhere along the signal lines to change the signal lines from the first wiring layers to the second wiring layers, the increase in area where the signal lines are routed can be reduced.

Here, as illustrated in FIGS. 4-11, the pitch denote the distance between the center lines of each adjacent pair of structural units. While the pitch principally denote the distance between the center lines of each adjacent pair of structural units, a location in each of adjacent two of structural units (e.g., one ends of the structural units) may be previously determined, and the pitch may be the distance between the predetermined locations.

The pitch $P_a$ may be equal to the pitch $P_d$, and the pitch $P_b$ may be equal to the pitch $P_c$.

With the configuration, the pitch $P_d$ between each adjacent pair of portions of the first and second signal lines near the display region is equal to the pitch $P_d$ between each adjacent pair of the second connectors, and the pitch $P_b$ between each adjacent pair of portions of the first and second signal lines near the mounting region is equal to the pitch $P_c$ between each adjacent pair of the first connectors. Thus, the angles $\theta_a$ and $\theta_b$ formed by the direction of extension of the second signal lines are equal to each other, and the second signal lines each extend in a substantially straight line. This can efficiently reduce the increase in area where the second signal lines are routed.

One of the first connectors closest to the second connectors and one of the second connectors closest to the first connectors may be spaced at a pitch $P_e$, and the pitch $P_e$ may be greater than the pitch $P_c$ and less than the pitch $P_d$.

With the configuration, one of the first connectors closest to the second connectors and one of the second connectors closest to the first connectors are spaced at the pitch $P_e$, and the pitch $P_e$ is greater than the pitch $P_c$ and less than the pitch $P_d$. This can provide a buffer region between a group of the first connectors spaced at the pitch $P_c$ and a group of the second connectors spaced at the pitch $P_d$. The buffer region is configured to eliminate layout disadvantages arising from the difference between the pitches.

The first and second connectors may be arranged along the edge of the display region.

With the configuration, the first and second connectors are arranged along the edge of the display region. This allows a member having a simple shape to protect the first and second connectors.

The display region may include a plurality of source signal lines extending in parallel in the direction orthogonal to the edge of the display region, and the first and second signal lines may be a plurality of video signal lines each connected through a switch circuit to some of the source signal lines that are equal in number to colors forming a pixel.

With the configuration, the first and second signal lines are the video signal lines each connected through a switch circuit to some of the source signal lines provided in the display region to extend in parallel. The some of the source signal lines are equal in number to colors forming a pixel. Such a configuration allows the number of the video signal lines to be less than that of the source signal lines. This can increase the degree of concentration of the video signal lines, and thus, reduce the increase in area where the video signal lines are routed.

The display region may include a plurality of display signal lines extending in parallel in the direction orthogonal to the edge of the display region, and the first and second signal lines may be each connected to a corresponding one of the display signal lines.

With the configuration, the first and second signal lines are each connected to a corresponding one of the display signal lines provided in the display region to extend in parallel. Thus, for example, an active matrix substrate in which a drive circuit mounted on the mounting region is connected to the display signal lines is specifically formed.

The display signal lines may be source signal lines.

With the configuration, the display signal lines are the source signal lines. Thus, for example, an active matrix substrate in which a drive circuit mounted on the mounting region is connected to the source signal lines is specifically formed.

The mounting region may be defined in a portion of the non-display region corresponding to a central portion of the edge of the display region, the first signal lines may be symmetrically placed with respect to an axis orthogonal to the central portion of the edge of the display region, and the second signal lines may be located laterally outward of the first signal lines.

With the configuration, the first and second signal lines are symmetrically placed with respect to the axis orthogonal to the central portion of the edge of the display region. This reduces the length of each of the first and second signal lines, and reduces the increase in area where the first and second signal lines are routed.

A display panel according to the present disclosure includes: the active matrix substrate of any one of claims 1-8; a counter substrate facing the active matrix substrate; and a display medium layer provided between the active matrix substrate and the counter substrate.

With the configuration, the display panel includes the active matrix substrate and the counter substrate that face each other, and the display medium layer provided between the substrates. Thus, even if, in the display panel including the active matrix substrate, the non-display region includes the connectors provided somewhere along the signal lines to change the signal lines from the first wiring layers to the second wiring layers, the increase in area where the signal lines are routed can be reduced.

The display medium layer may be a liquid crystal layer.

With the configuration, the display medium layer is the liquid crystal layer. Thus, a liquid crystal display panel is specifically formed as the display panel.

A frame-shaped sealing material may be provided between the active matrix substrate and the counter substrate to enclose the liquid crystal layer, and the first and second connectors may overlap a side of the sealing material.

With the configuration, the first and second connectors overlap the side of the sealing material between the active matrix substrate and the counter substrate. This allows the side of the sealing material to protect the first and second connectors.

Advantages of the Invention

According to the present disclosure, in a non-display region, the pitch between each adjacent pair of a plurality of second connectors each included in a corresponding one of a plurality of second signal lines is greater than the pitch between each adjacent pair of a plurality of first connectors each included in a corresponding one of a plurality of first signal lines. Thus, even if the non-display region includes the connectors provided somewhere along the signal lines to change the signal lines from first wiring layers to second wiring layers, the increase in area where the signal lines are routed can be reduced.

DESCRIPTION OF EMBODIMENTS

Embodiments of the present disclosure will be described hereinafter in detail with reference to the drawings. The present disclosure is not limited to the following embodiments.

First Embodiment of the Disclosure

Figure 1:
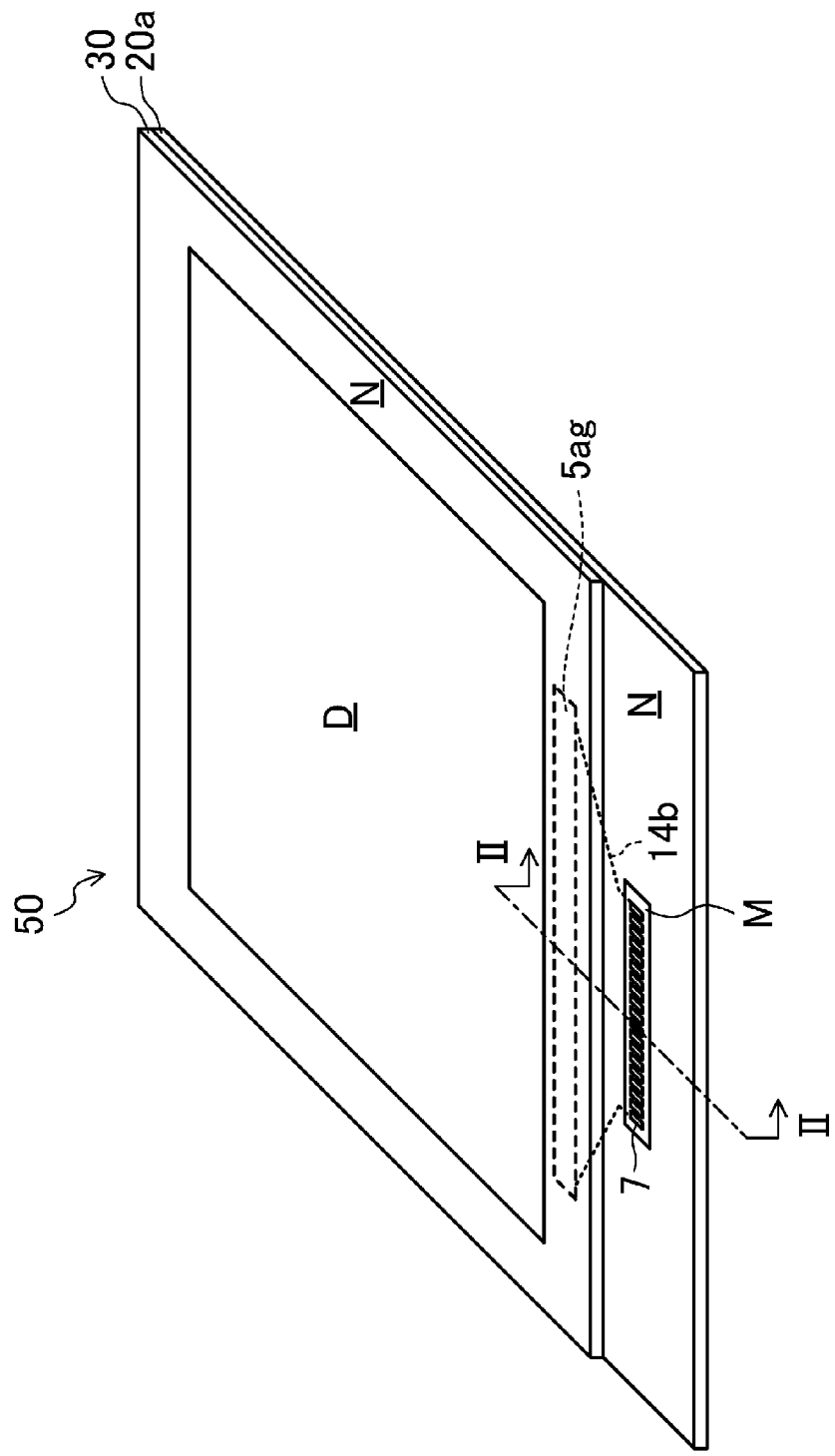
FIG. 1 is a perspective view of a liquid crystal display panel according to a first embodiment.
Figure 2:
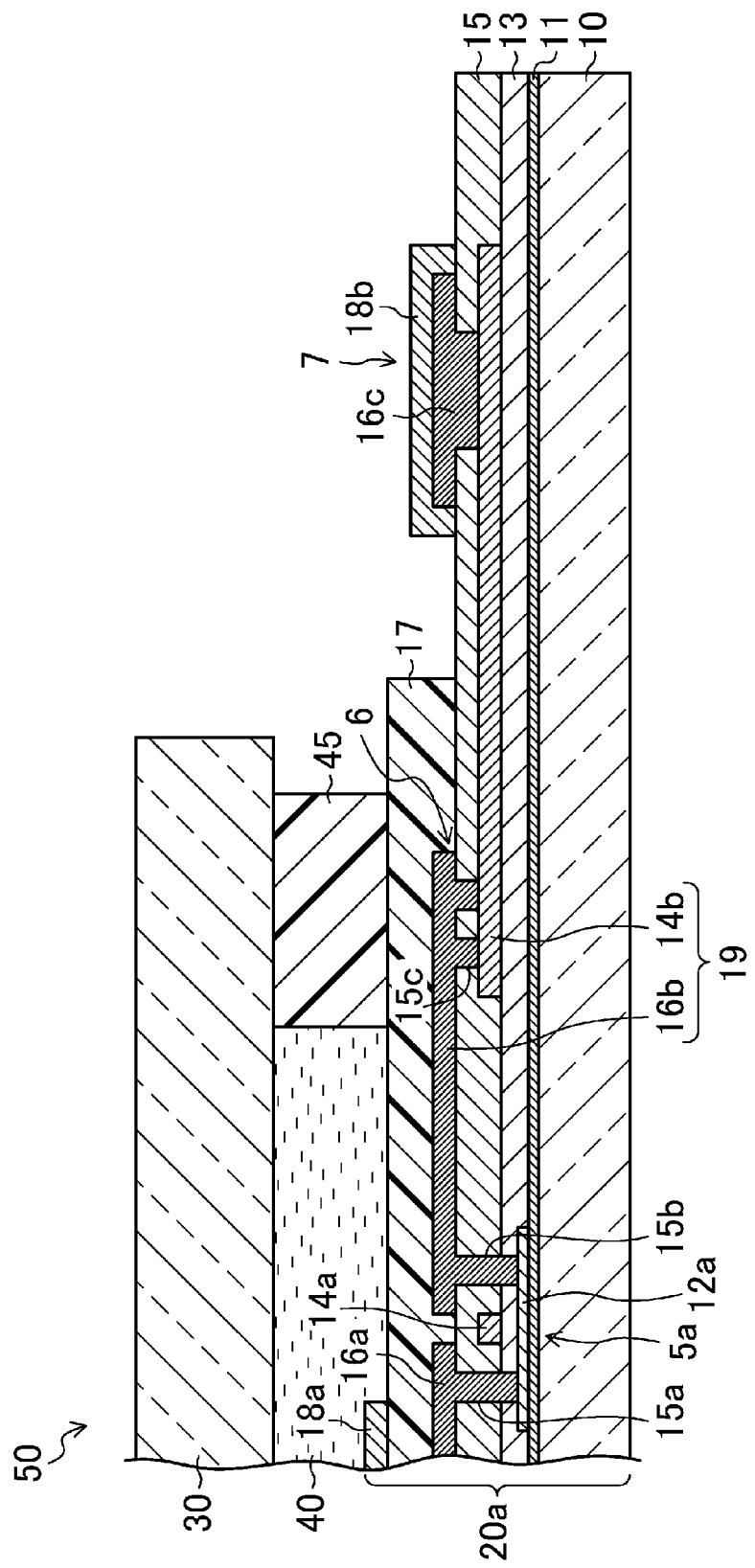
FIG. 2 is a cross-sectional view of the liquid crystal display panel taken along the line II-II in FIG. 1.
Figure 3:
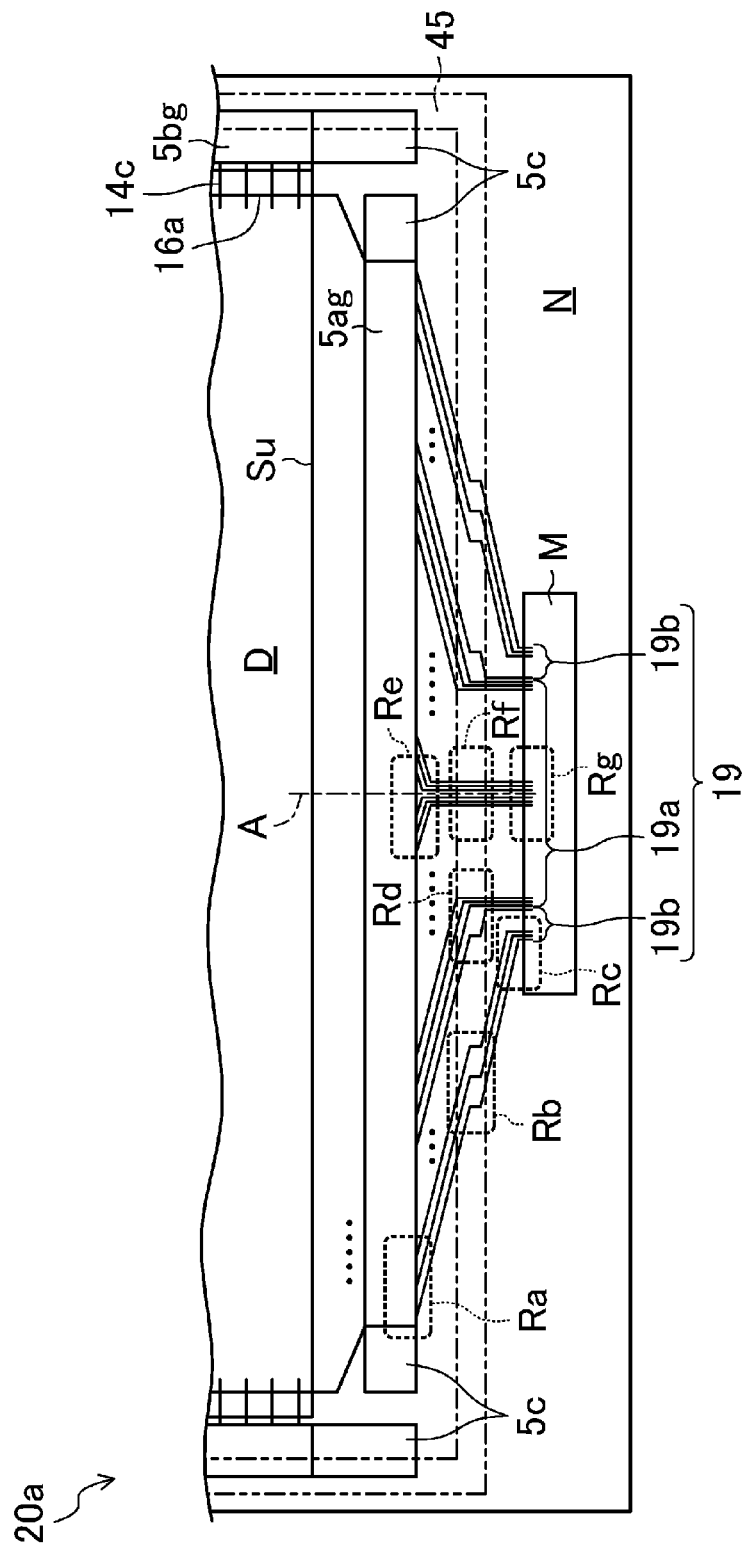
FIG. 3 is a plan view of an active matrix substrate forming a portion of the liquid crystal display panel according to the first embodiment.
Figure 4:
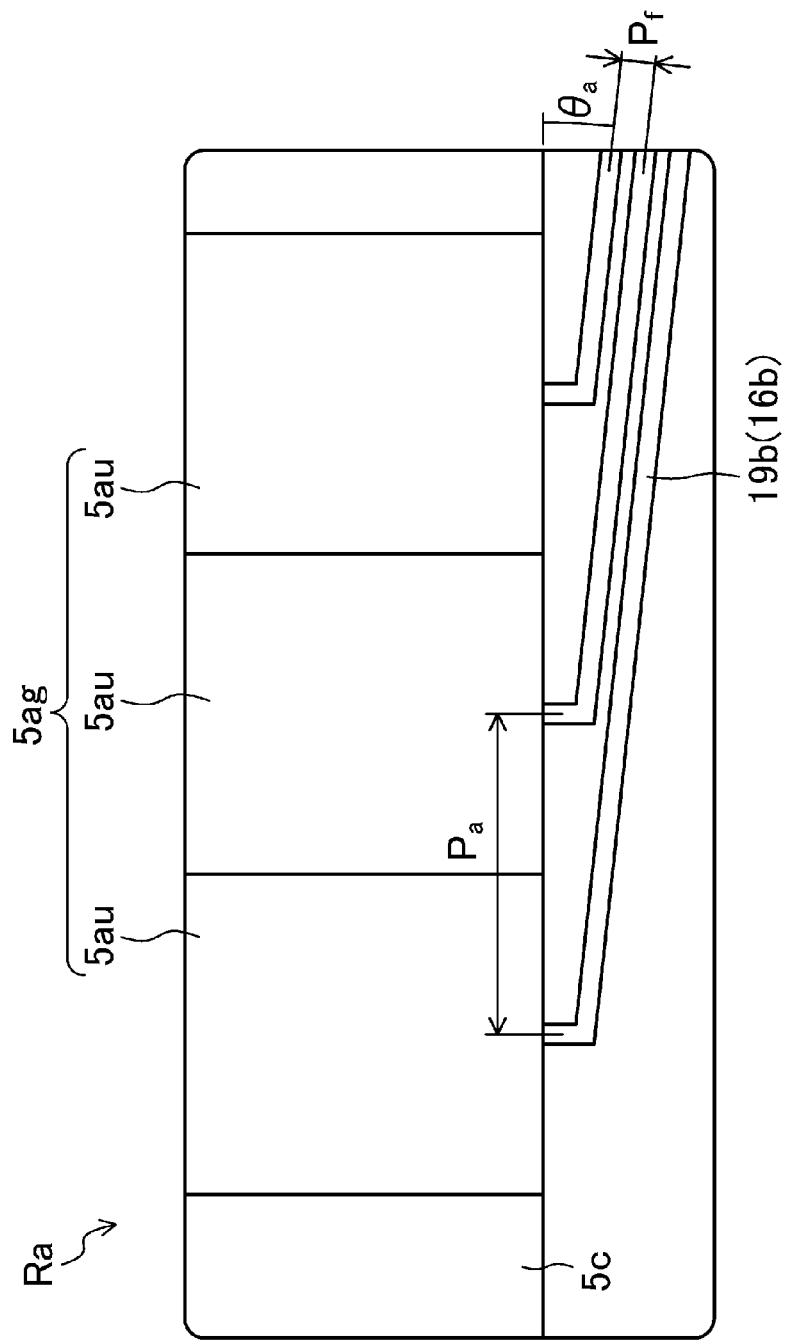
FIG. 4 is an enlarged plan view of a region Ra in FIG. 3.

FIGS. 1-10 illustrate an active matrix substrate according to a first embodiment of the present disclosure and a display panel including the same according to the first embodiment. Specifically, FIG. 1 is a perspective view of a liquid crystal display panel 50 according to this embodiment, and FIG. 2 is a cross-sectional view of the liquid crystal display panel 50 taken along the line II-II in FIG. 1. FIG. 3 is a plan view of an active matrix substrate 20a forming a portion of the liquid crystal display panel 50. Furthermore, FIGS. 4, 5, 6, 7, 8, 9, and 10 are enlarged plan views of regions Ra, Rb, Rc, Rd, Re, Rf, and Rg, respectively, in FIG. 3.

As illustrated in FIGS. 1 and 2, the liquid crystal display panel 50 includes the active matrix substrate 20a and a counter substrate 30 facing each other, a liquid crystal layer 40 that is a display medium layer provided between the active matrix substrate 20a and the counter substrate 30, and a sealing material 45 bonding the active matrix substrate 20a and the counter substrate 30 together and having a frame shape for enclosing the liquid crystal layer 40 between the active matrix substrate 20a and the counter substrate 30.

As illustrated in FIG. 1, in each of the active matrix substrate 20a, the counter substrate 30, and the liquid crystal display panel 50, a rectangular display region D for displaying an image is defined inside the sealing material 45 (see FIG. 2), and a frame-shaped non-display region N is defined around the display region D. Furthermore, as illustrated in FIGS. 1 and 3, a mounting region M for mounting, e.g., an integrated circuit (IC) chip as a drive circuit is defined in the non-display region N (terminal region) of the active matrix substrate 20a protruding beyond the counter substrate 30 to correspond to a central portion of an edge of the display region D (the lower edge Su in FIG. 3).

As illustrated in FIGS. 2 and 3, the active matrix substrate 20a includes a transparent substrate 10, such as a glass substrate, a plurality of gate signal lines 14c, an interlayer insulating film 15 covering the gate signal lines 14c, a plurality of source signal lines 16a, a plurality of thin film transistors (TFTs: not shown), a protective insulating film 17 covering the TFTs, a plurality of pixel electrodes 18a, and an alignment film (not shown) covering the pixel electrodes 18a. The gate signal lines 14c are provided on a region of the transparent substrate 10 corresponding to the display region D with an underlying film 11 and a gate insulating film 13 interposed between the gate signal lines 14c and the transparent substrate 10, and extend in parallel in a horizontal direction in FIG. 3. The source signal lines 16a are provided on a region of the interlayer insulating film 15 corresponding to the display region D, and extend in parallel in a direction orthogonal to the gate signal lines 14c (in a vertical direction in FIG. 3). The TFTs are each provided for an intersection of one of the gate signal lines 14c and one of the source signal lines 16a, and in other words, are in a one-to-one correspondence with sub-pixels serving as minimum units of an image. The pixel electrodes 18a are provided in a matrix on a region of the protective insulating film 17 corresponding to the display region D, and are each connected to a corresponding one of the TFTs.

The TFTs being in a one-to-one correspondence with the subpixels each include, for example, an island-like semiconductor layer on the underlying film 11, a portion of the gate insulating film 13 over the semiconductor layer, a gate electrode provided on the gate insulating film 13 to overlap a portion of the semiconductor layer, a portion of the interlayer insulating film 15 covering the gate electrode, and source and drain electrodes provided on the interlayer insulating film 15 so as to be spaced apart from each other. The TFTs each have the same configuration as each of TFTs 5a of a switch circuit described below. Here, the gate electrode is a portion of each of the gate signal lines 14c corresponding to a corresponding one of the sub-pixels or a portion of each of the gate signal lines 14c protruding laterally and corresponding to a corresponding one of the sub-pixels. The source electrode is a portion of each of the source signal lines 16a corresponding to a corresponding one of the sub-pixels or a portion of each of the source signal lines 16a protruding laterally and corresponding to a corresponding one of the pub-pixels. Furthermore, the drain electrode is connected through a contact hole formed in the protective insulating film 17 to a corresponding one of the pixel electrodes 18a.

As illustrated in FIG. 3, both ends of each of the gate signal lines 14c are each connected to a corresponding one of row control circuits 5bg. Here, as illustrated in FIG. 3, the row control circuits 5bg are monolithically formed along the left and right edges of the display region D in this figure. Furthermore, as illustrated in FIG. 3, associated circuits 5c, such as a level shifter circuit, a buffer circuit, and a protection circuit, are provided near each of the row control circuits 5bg. Driving the gate signal lines 14c from both ends thereof can reduce crosstalk (shadowing) that may be caused by increasing the resolution of a pixel array.

As illustrated in FIG. 3, one end of each of the source signal lines 16a is connected to a column control circuit 5ag. Here, as illustrated in FIG. 3, the column control circuit 5ag is monolithically formed along the lower edge of the display region D in this figure. Furthermore, as illustrated in FIG. 3, other associated circuits 5c, such as a level shifter circuit, a buffer circuit, and a protection circuit, are provided near the column control circuit 5ag.

As illustrated in FIG. 2, a TFT 5a located in each of unit circuit regions 5au (see FIG. 4) forming the column control circuit 5ag includes an island-like semiconductor layer 12a on the underlying film 11, a portion of the gate insulating film 13 covering the semiconductor layer 12a, a gate electrode 14a provided on the gate insulating film 13 to overlap a portion of the semiconductor layer 12a, a portion of the interlayer insulating film 15 covering the gate electrode 14a, and a source electrode (16a) and a drain electrode (16b) provided on the interlayer insulating film 15 so as to be spaced apart from each other. The TFT 5a is a switch circuit (RGB switch circuit) configured to sort signals transferred through a single video signal line 19 described below into, e.g., three of the source signal lines 16a based on the number of colors of a corresponding one of pixels (e.g., three colors such as RGB).

The semiconductor layer 12a includes a channel region (not shown) overlapping the gate electrode 14a, and source and drain regions (not shown) spaced apart from each other with the channel region interposed therebetween. A lightly doped drain (LDD) region may be provided between the channel region of the semiconductor layer 12a and each of the source and drain regions thereof.

As illustrated in FIG. 2, the source electrode (16a) of the TFT 5a is connected to the source region of the semiconductor layer 12a through a contact hole 15a formed in a stack of the gate insulating film 13 and the interlayer insulating film 15, and forms a portion of a corresponding one of the source signal lines 16a.

As illustrated in FIG. 2, the drain electrode (16b) of the TFT 5a is connected to the drain region of the semiconductor layer 12a through a contact hole 15b formed in the stack of the gate insulating film 13 and the interlayer insulating film 15, and forms a portion of a first wiring layer 16b of a corresponding one of a plurality of video signal lines 19 described below.

As illustrated in FIG. 2, the non-display region N of the active matrix substrate 20a includes the video signal lines 19 each including the first wiring layer 16b near the display region D, and a second wiring layer 14b near the mounting region M. The second wiring layer 14b is connected to the first wiring layer 16b through a connector 6 that is a contact hole 15c formed in the stack of the gate insulating film 13 and the interlayer insulating film 15. Here, as illustrated in FIGS. 1 and 2, a source conductive layer 16c and a transparent conductive layer 18b are stacked on an end portion of the second wiring layer 14b in the mounting region M to form a terminal portion 7.

Figure 7:
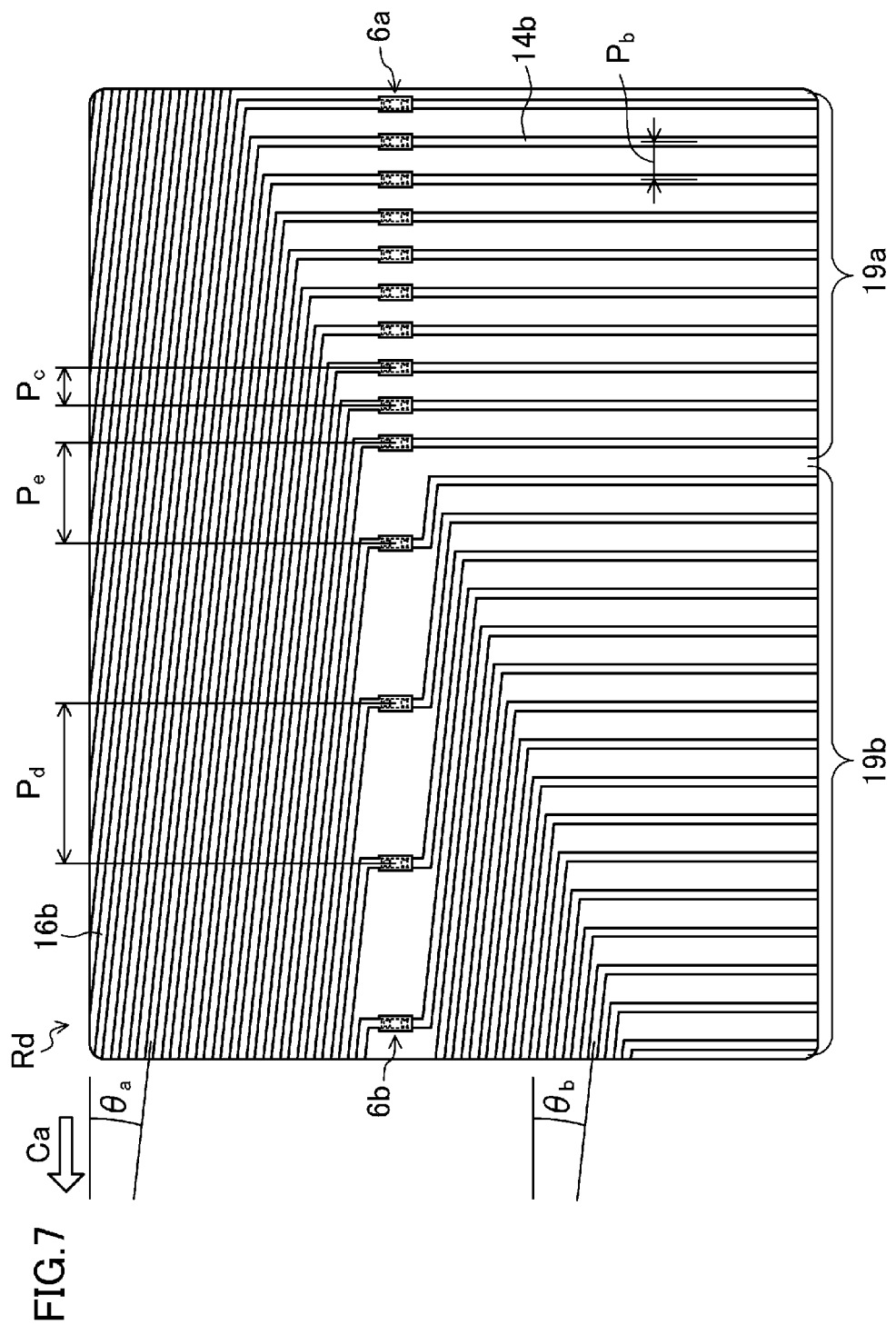
FIG. 7 is an enlarged plan view of a region Rd in FIG. 3.
Figure 8:
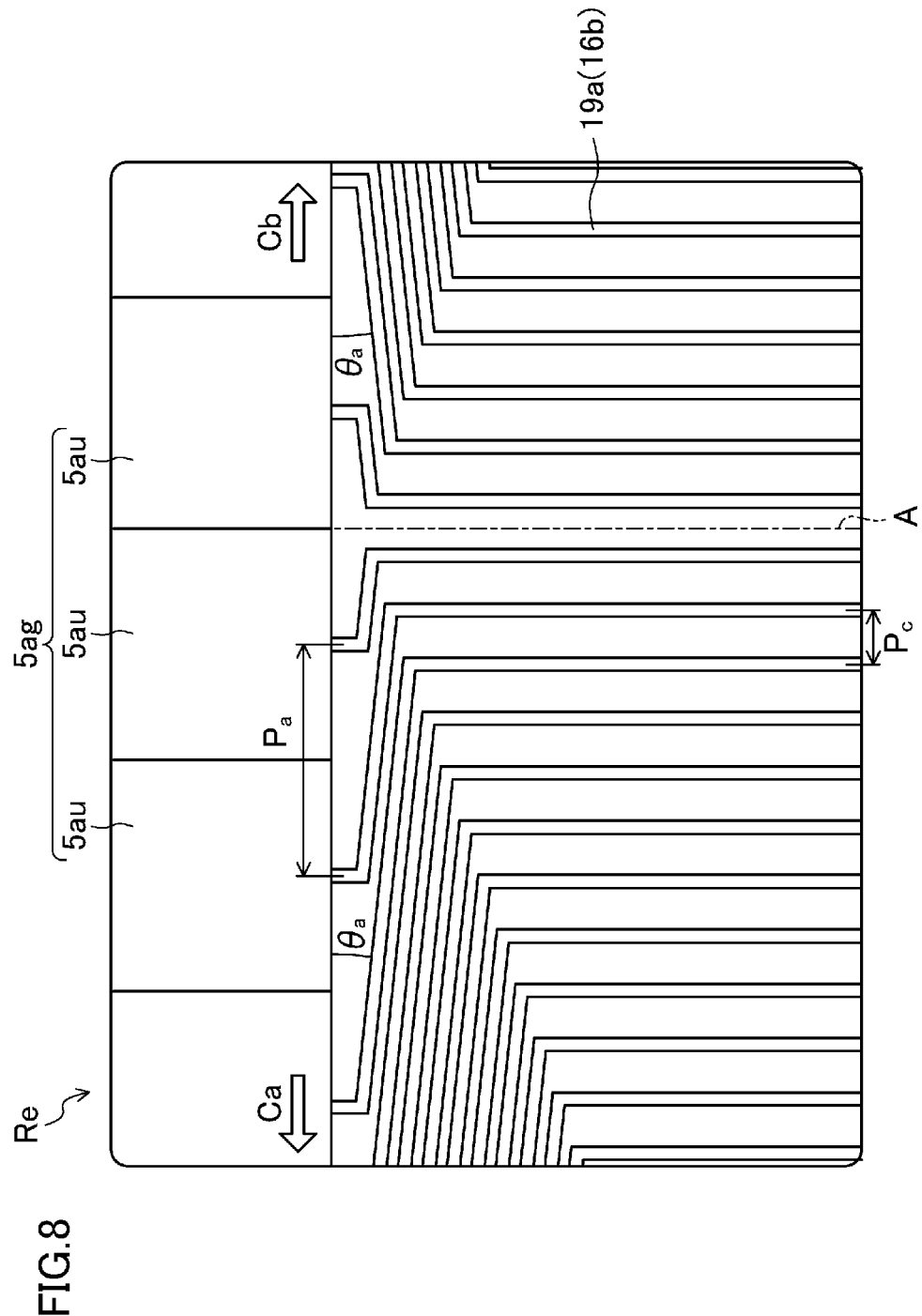
FIG. 8 is an enlarged plan view of a region Re in FIG. 3.

As illustrated in FIG. 3, the video signal lines 19 include a plurality of first signal lines 19a, and a plurality of second signal lines 19b. The first signal lines 19a are located inwardly of the second signal lines 19b, and the second signal lines 19b are located laterally outward of the first signal lines 19a. Here, as illustrated in FIG. 7, the second signal lines 19b located to the left in FIG. 3 are adjacent to the first signal lines 19a in a reference direction Ca of an angle $\theta_a$. The second signal lines 19b located to the right in FIG. 3 are adjacent to the first signal lines 19a in a reference direction Cb (see FIG. 8) of the angle $\theta_a$.

As illustrated in FIGS. 3 and 7-10, the first signal lines 19a are symmetrically placed preferably with respect to an axis A orthogonal to the central portion of the edge of the display region D (the lower edge Su in FIG. 3) to extend in parallel from near the display region D in a direction orthogonal to the edge of the display region D (the lower edge Su in FIG. 3) while being spaced at pitches $P_a$, then extend in parallel in a direction that intersects the edge of the display region D (the lower edge Su in FIG. 3) at the angle $\theta_a$, and further extend to the mounting region M in parallel in the direction orthogonal to the edge of the display region D (the lower edge Su in FIG. 3) while being spaced at pitches $P_b$.

Figure 9:
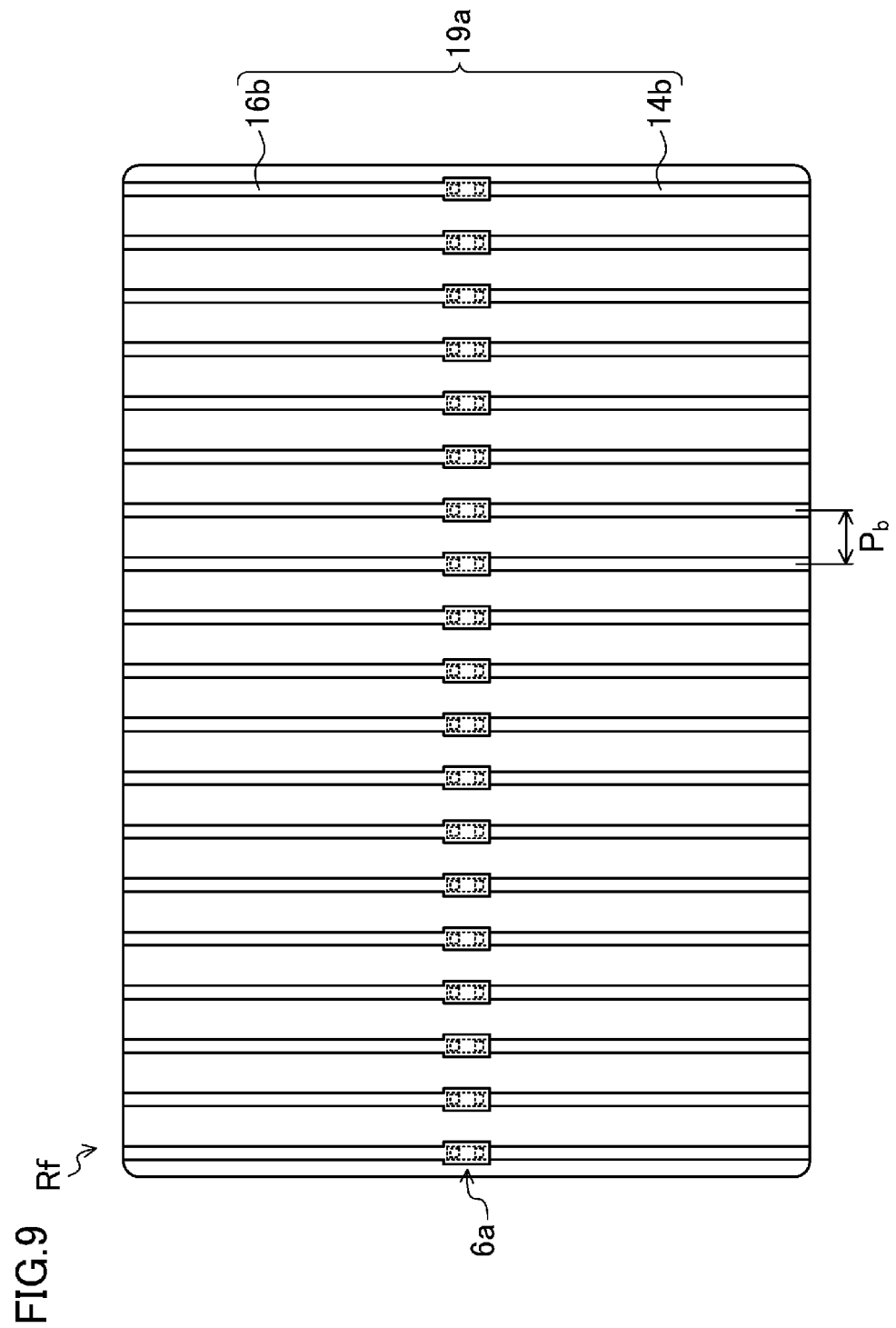
FIG. 9 is an enlarged plan view of a region Rf in FIG. 3.
Figure 10:
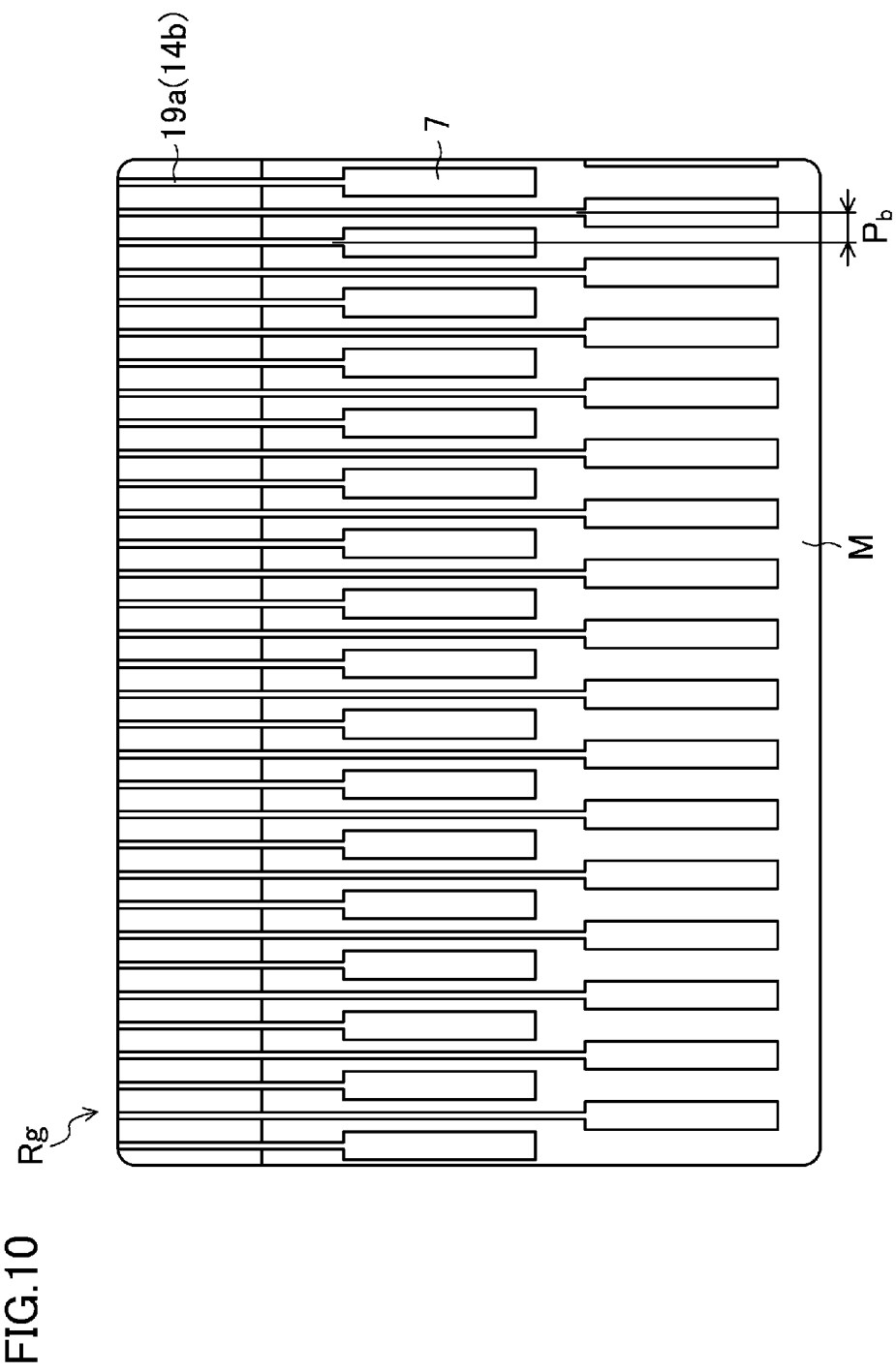
FIG. 10 is an enlarged plan view of a region Rg in FIG. 3.

As illustrated in FIGS. 7 and 9, the first signal lines 19a include a plurality of first connectors 6a spaced at pitches $P_c$ and each connecting the first wiring layer 16b to the second wiring layer 14b along a direction orthogonal to the edge of the display region D (the lower edge Su in FIG. 3). The first connectors 6a are in a one-to-one correspondence with the first signal lines 19a. Here, the pitch $P_c$ between each adjacent pair of the first connectors 6a is equal to the pitch $P_b$ between each adjacent pair of portions of the first signal lines 19a in the mounting region M or between each adjacent pair of portions of the second signal lines 19b in the mounting region M.

As illustrated in FIGS. 3-7, the second signal lines 19b extend in parallel from near the display region D in the direction orthogonal to the edge of the display region D (the lower edge Su in FIG. 3) while being spaced at the pitches $P_a$, then extend in parallel in the direction that intersects the edge of the display region D (the lower edge Su in FIG. 3) at the angle $\theta_a$, subsequently extend in parallel in the direction orthogonal to the edge of the display region D (the lower edge Su in FIG. 3), further extend in parallel in the direction that intersects the the edge of the display region D (the lower edge Su in FIG. 3) at an angle $\theta_b$, and finally extend to the mounting region M in parallel in the direction orthogonal to the edge of the display region D (the lower edge Su in FIG. 3) while being spaced at the pitches $P_b$.

Figure 5:
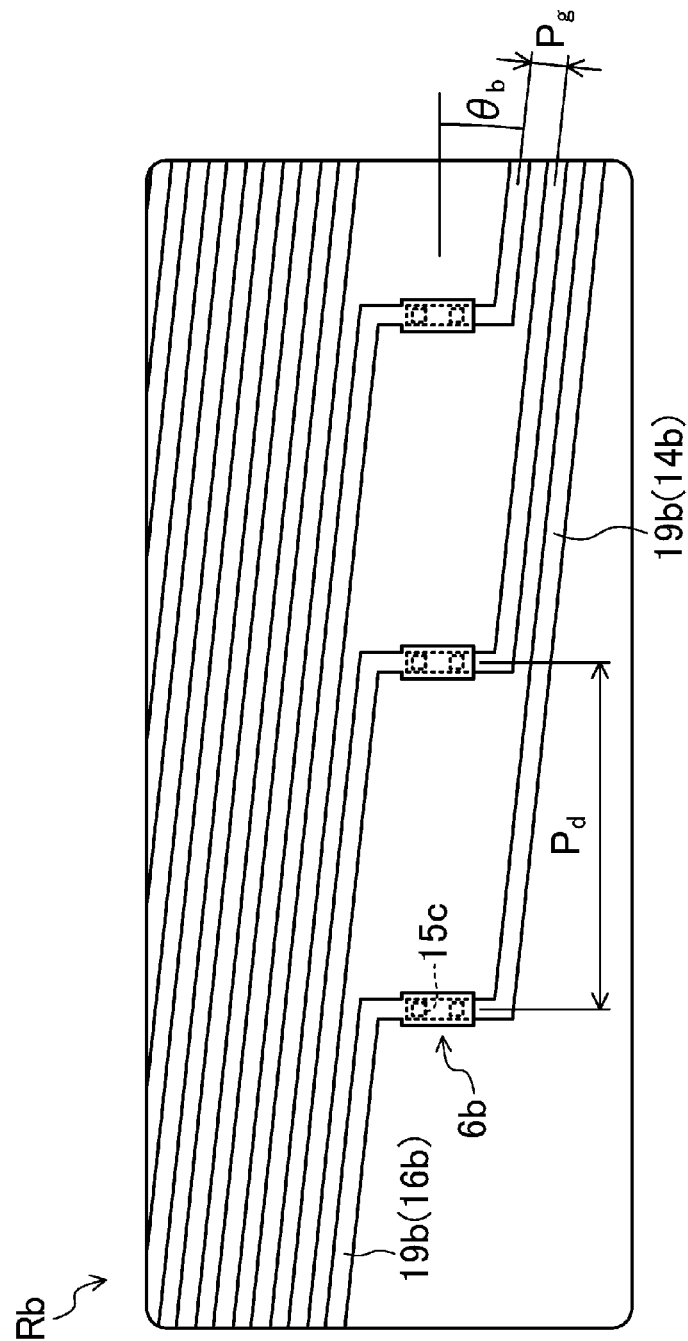
FIG. 5 is an enlarged plan view of a region Rb in FIG. 3.
Figure 6:
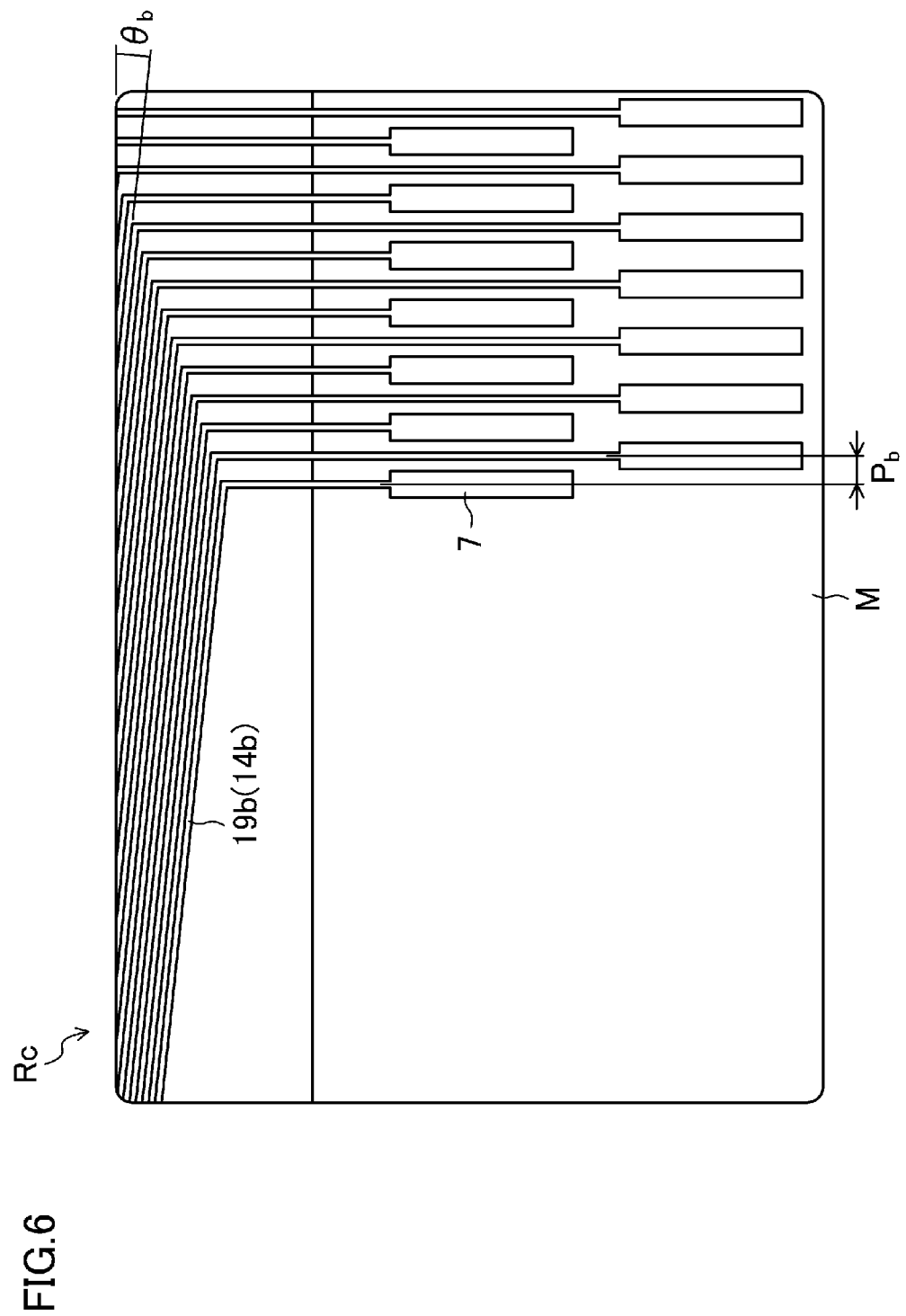
FIG. 6 is an enlarged plan view of a region Rc in FIG. 3.

As illustrated in FIGS. 5 and 7, the second signal lines 19b include a plurality of second connectors 6b spaced at pitches $P_d$ greater than the pitches $P_c$ and each connecting the first wiring layer 16b to the second wiring layer 14b along the direction orthogonal to the edge of the display region D (the lower edge Su in FIG. 3). The second connectors 6b are in a one-to-one correspondence with the second signal lines 19b. Here, the pitch $P_d$ between each adjacent pair of the second connectors 6b is equal to the pitch $P_a$ between each adjacent pair of portions of the first signal lines 19a near the display region D or between each adjacent pair of portions of the second signal lines 19b near the display region D.

One of the first connectors 6a closest to the second connectors 6b and one of the second connectors 6b closest to the first connectors 6a are spaced at a pitch $P_e$ as illustrated in FIG. 7. Here, the pitch $P_e$ is greater than the pitch $P_c$ and less than the pitch $P_d$.

Specifically, a feature of this embodiment is that, as described above, while the first and second signal lines 19a and 19b functioning as the video signal lines 19 have the same function, the pitch $P_c$ between each adjacent pair of the first connectors 6a of the first signal lines 19a corresponding to some of the video signal lines 19, the pitch $P_d$ between each adjacent pair of the second connectors 6b of the second signal lines 19b corresponding to the other ones of the video signal lines 19, and the pitch $P_e$ between the one of the first connectors 6a closest to the second connectors 6b and the one of the second connectors 6b closest to the first connectors 6a are designed to be intentionally different from one another.

As illustrated in FIGS. 2, 3, 5, 7, and 9, the first and second connectors 6a and 6b are arranged along the edge of the display region D (the lower edge Su in FIG. 3) to overlap a side of the sealing material 45.

While, in this embodiment, a line structure in which the video signal lines 19 are symmetrically placed with respect to the axis A is exemplified, the video signal lines 19 may be asymmetrically placed with respect to the axis A. Specifically, for example, when the mounting region M is shifted from the central portion of the edge of the display region D (the lower edge Su in FIG. 3), the outline of a group of the video signal lines 19 is asymmetrical with respect to the axis A. Portions of the video signal lines 19 extending to the mounting region M in parallel while being spaced at the pitches $P_b$ do not need to be in the form of simply straight parallel lines. For example, the portions of the video signal lines 19 may extend to the mounting region M in parallel (side-by-side) while gently meandering in order to allow the video signal lines 19 to have the same length. Specifically, the term "parallel lines" and the term "extending in parallel" herein are conceptually different from each other, and the scope of the term "extending in parallel" is broader than that of the term "parallel lines."

The counter substrate 30 includes, for example, a transparent substrate (not shown), such as a glass substrate, a black matrix (not shown) provided in a grid pattern on the transparent substrate, a plurality of color layers (not shown) including red, green, and blue layers provided between the grid lines of the black matrix, a common electrode (not shown) covering the black matrix and the color layers, a plurality of columnar photo spacers (not shown) provided on the common electrode, and an alignment film (not shown) covering the common electrode and the photo spacers.

The liquid crystal layer 40 is made of, for example, a nematic liquid crystal material having electro-optic characteristics.

In each of the sub-pixels of the liquid crystal display panel 50 having the above configuration, when a gate signal is transferred from the row control circuit 5bg through a corresponding one of the gate signal lines 14c to the gate electrode, and the TFT is turned on, a source signal is transferred from the IC chip mounted on the mounting region M through a corresponding one of the video signal lines 19, the column control circuit 5ag, and a corresponding one of the source signal lines 16a to the source electrode to write a predetermined charge into the pixel electrode 18a through the semiconductor layer and the drain electrode. In this case, in the liquid crystal display panel 50, a potential difference occurs between the pixel electrode 18a of the active matrix substrate 20a and the common electrode of the counter substrate 30, and a predetermined voltage is applied to the liquid crystal layer 40. In the liquid crystal display panel 50, the light transmittance of the liquid crystal layer 40 is adjusted in each sub-pixel by changing the magnitude of the voltage applied to the liquid crystal layer 40 and thereby changing the oriented state of the liquid crystal layer 40, and an image is, therefore, displayed on the display region D.

Next, a method for fabricating a liquid crystal display panel 50 according to this embodiment will be described. Here, the method for fabricating a liquid crystal display panel 50 according to this embodiment includes the steps of fabricating an active matrix substrate, fabricating a counter substrate, and injecting liquid crystal.

<Active Matrix Substrate Fabrication Step>

First, for example, a silicon nitride film, a silicon oxide film, or a stack of them is deposited to a thickness of about 50 nm by, e.g., chemical vapor deposition (CVD) on a transparent substrate 10, such as a glass substrate, to form an underlying film 11.

Subsequently, an intrinsic amorphous silicon film is deposited to a thickness of about 50 nm by, e.g., CVD on the entire surface of the substrate including the underlying film 11, and then, is polycrystallized by annealing, such as applying laser beams to the intrinsic amorphous silicon film, to form a polysilicon film. The polysilicon film is subjected to photolithography, and is etched, and then, a used resist is removed, thereby forming, for example, a semiconductor layer 12a.

Thereafter, for example, a silicon nitride film, a silicon oxide film, or a stack of them is deposited to a thickness of about 100 nm by, e.g., CVD on the entire surface of the substrate including, e.g., the semiconductor layer 12a, thereby forming a gate insulating film 13.

Furthermore, a metal film, such as a tungsten film, is deposited to a thickness of about 300 nm by, e.g., sputtering on the entire surface of the substrate including the gate insulating film 13. Then, the metal film is subjected to photolithography, and is etched, and a used resist is removed, thereby forming, for example, gate signal lines 14c, gate electrodes 14a, and second wiring layers 14b.

Subsequently, impurities, such as phosphorus, are implanted into, for example, the semiconductor layer 12a of the substrate including, e.g., the gate signal lines 14c, using the gate electrodes 14a as masks, to form a channel region, a source region, and a drain region in, e.g., the semiconductor layer 12a.

Furthermore, an inorganic insulating film, such as a silicon nitride film, a silicon oxide film, or a stack of them, is deposited to a thickness of about 700 nm by, e.g., CVD on the entire surface of the substrate including the semiconductor layer 12a having the channel region, the source region, and the drain region. Then, the inorganic insulating film and the gate insulating film 13 under the inorganic insulating film are subjected to photolithography, and are etched, and a used resist is removed, thereby forming an interlayer insulating film 15 having contact holes 15a, 15b, and 15c.

Then, a metal film, such as an aluminum film, is deposited to a thickness of about 350 nm by, e.g., sputtering on the entire surface of the substrate including the interlayer insulating film 15. Thereafter, the metal film is subjected to photolithography, and is etched, and a used resist is removed, thereby forming, for example, source signal lines (source electrodes) 16a, first wiring layers (drain electrodes) 16b, and source conductive layers 16c. As a result, TFTs 5a and a column control circuit 5ag including the same are formed. At this time, TFTs placed in a one-to-one correspondence with pixels and row control circuits 5bg are also simultaneously formed.

Furthermore, a photosensitive acrylic resin film is applied in a thickness of about 2 μm by, e.g., spin coating or slit coating onto the entire surface of the substrate including, e.g., the source signal lines 16a. Subsequently, the applied film is prebaked, exposed to light, developed, and postbaked, thereby forming a protective insulating film 17 having contact holes.

Then, a transparent conductive film, such as an indium tin oxide (ITO) film, is deposited to a thickness of about 100 nm by, e.g., sputtering on the entire surface of the substrate including the protective insulating film 17. Thereafter, the transparent conductive film is subjected to photolithography, and is etched, and a used resist is removed, thereby forming pixel electrodes 18a and transparent conductive layers 18b.

Finally, the entire surface of the substrate including, e.g., the pixel electrodes 18a is coated with a polyimide resin film by, e.g., spin coating, slit coating, or printing, and then is subjected to baking and rubbing, thereby forming an alignment film.

In the foregoing manner, an active matrix substrate 20a of this embodiment can be fabricated.

<Counter Substrate Fabrication Step>

First, the entire surface of a transparent substrate, such as a glass substrate, is coated with a black-colored photosensitive resin by, e.g., spin coating or slit coating, and then is exposed to light and developed, thereby forming a black matrix with a thickness of about 1 μm.

Subsequently, the entire surface of the substrate including the black matrix is coated with a red-, green-, or blue-colored photosensitive resin by, e.g., spin coating or slit coating, and then is exposed to light and developed, thereby forming a colored film of a selected color (e.g., a red film) with a thickness of about 1-3 μm. Similar processes are repeatedly performed for the other two colors, thereby forming colored films of the other two colors (e.g., a green film and a blue film) each with a thickness of about 1-3 μm.

Then, a transparent conductive film, such as an ITO film, for example, is deposited to a thickness of about 100 nm, by sputtering with a mask, on the entire surface of the substrate including the colored films, thereby forming a common electrode.

Then, a photosensitive acrylic resin film is applied in a thickness of about 4 μm onto the entire surface of the substrate including the common electrode by, e.g., spin coating or slit coating, and then, the applied film is prebaked, exposed to light, developed, and postbaked, thereby forming photo spacers.

Finally, a polyimide resin film is applied by, e.g., spin coating, slit coating, or printing onto the entire surface of the substrate including the photo spacers, and then is subjected to baking and rubbing, thereby forming an alignment film.

In the foregoing manner, a counter substrate 30 of this embodiment can be fabricated.

<Liquid Crystal Injection Step>

First, for example, a sealing material 45 of, e.g., an ultraviolet (UV)/thermosetting resin is printed in a frame shape on the surface of the counter substrate 30 fabricated in the counter substrate fabrication step, and then a liquid crystal material (40) is dropped inside the frame of the sealing material 45.

Subsequently, the counter substrate 30 on which the liquid crystal material (40) has been dropped and the active matrix substrate 20a fabricated in the active matrix substrate fabrication step are bonded together under a reduced pressure to form a bonded assembly. This bonded assembly is then exposed to the air under an atmospheric pressure, thereby pressurizing the front and back surfaces of the bonded assembly.

Furthermore, the sealing material 45 enclosed in the bonded assembly is irradiated with UV light, and then the bonded assembly is heated, thereby curing the sealing material 45.

Finally, the bonded assembly enclosing the cured sealing material is cut by dicing, for example, and unwanted portions thereof are removed.

In the foregoing manner, a liquid crystal display panel 50 of this embodiment can be fabricated.

Next, the configurations of a plurality of second signal lines 19b according to an example of this embodiment will be specifically described. The characters $\theta_a$, $\theta_b$, $\theta_x$, and $\theta_y$ used herein and indicating angles or directions are each defined as an angle greater than 0° and less than 90°, which is clear from the line structure.

When the line width of a first wiring layer 16b of each of the second signal lines 19b is 4 μm, and the distance between each adjacent pair of the first wiring layers 16b is 4 μm, the pitch $P_f$ (see FIG. 4) between each adjacent pair of portions of the second signal lines 19b (the first wiring layers 16b) extending in a direction inclined at the angle $\theta_a$ is 8 μm. Thus, when the pitch $P_a$ is 75 μm, the angle $\theta_a$ is about 6.1° based on the relational expression $\sin \theta_a = P_f/P_a$. Assuming that the first and second wiring layers 16b and 14b are formed by photolithography using light-exposure apparatuses having substantially the same resolution, the pitch $P_g$ (see FIG. 5) between each adjacent pair of the second signal lines 19b (the second wiring layers 14b) extending in a direction inclined at the angle $\theta_b$ is 8 μm, which is equal to the pitch $P_f$. Furthermore, since the pitch $P_a$ is equal to the pitch $P_d$, the angle $\theta_b$ is also about 6.1° based on the relational expression $\sin \theta_b = P_g/P_d$. Thus, since, in the active matrix substrate 20a of the example, the angle $\theta_a$ is equal to the angle $\theta_b$, the second signal lines 19b can be considered as substantially straight lines, and thus, an ending point of the outermost one of the second signal lines 19b is located relatively inwardly.

When the locations of a display region D and a mounting region M are flexibly limited, and ending points of the second signal lines 19b do not need to be located relatively inwardly, it is preferable that the second signal lines 19b correspond to video signal lines having the line structure of this embodiment, and that the angle $\theta_b$ is greater than the angle $\theta_a$. In this case, the pitch $P_g$ can be greater than the pitch $P_f$, and thus, the line width of each of the second wiring layers can be greater than that of each of the first wiring layers. As such, the line width of each of the second wiring layers is increased to thereby reduce the increase in interconnect resistance of each of the second wiring layers, and a wiring material having good anti-corrosion properties and a high sheet resistance can be used as a material of the second wiring layers. As a result, the degree of wiring design flexibility can be improved.

Figure 15:
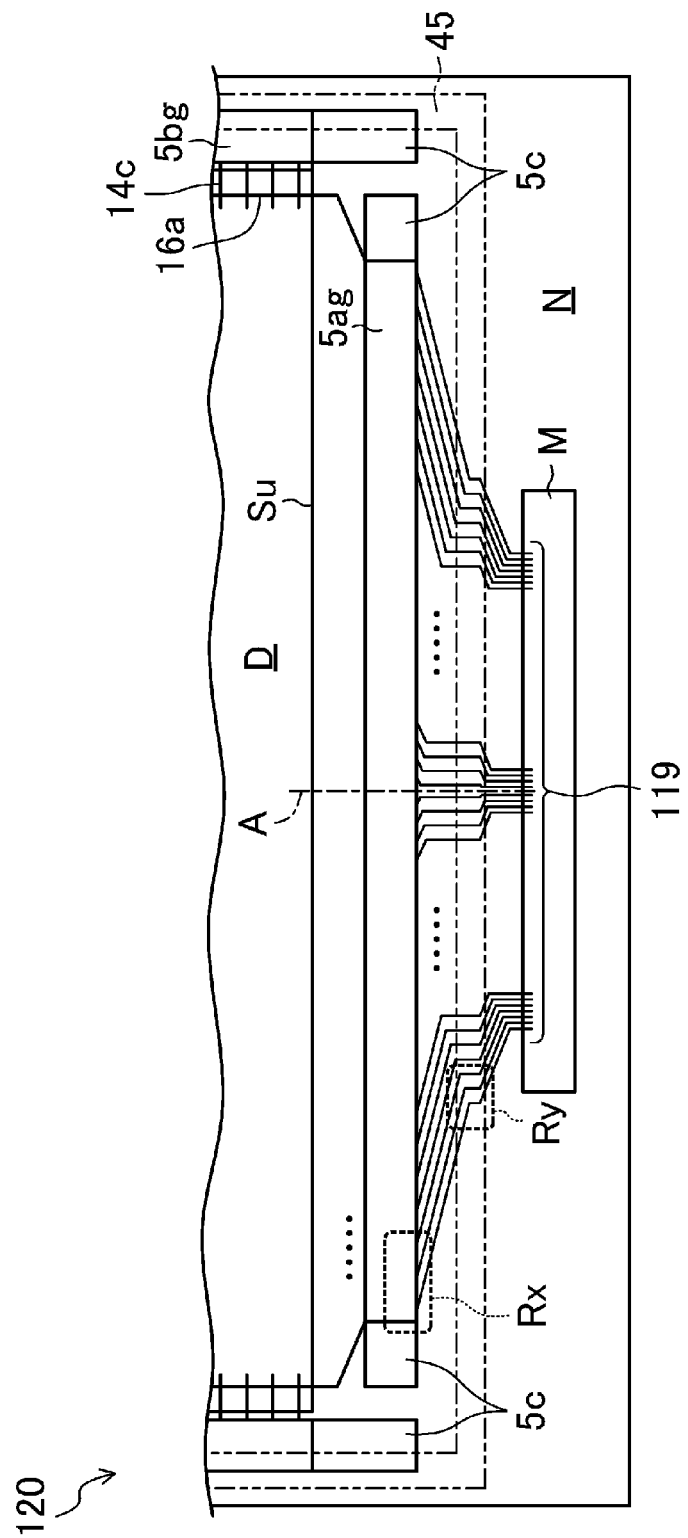
FIG. 15 is a plan view of an active matrix substrate according to a comparative example.
Figure 16:
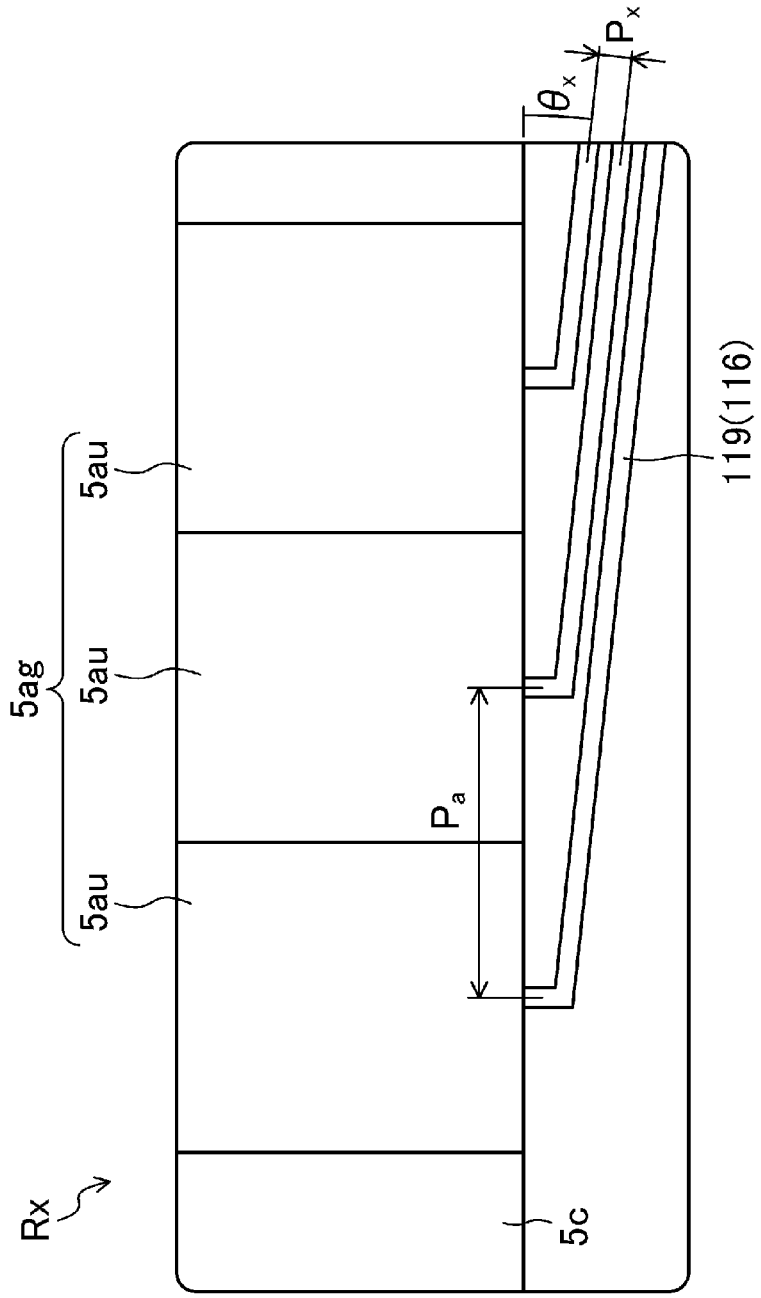
FIG. 16 is an enlarged plan view of a region Rx in FIG. 15.
Figure 17:
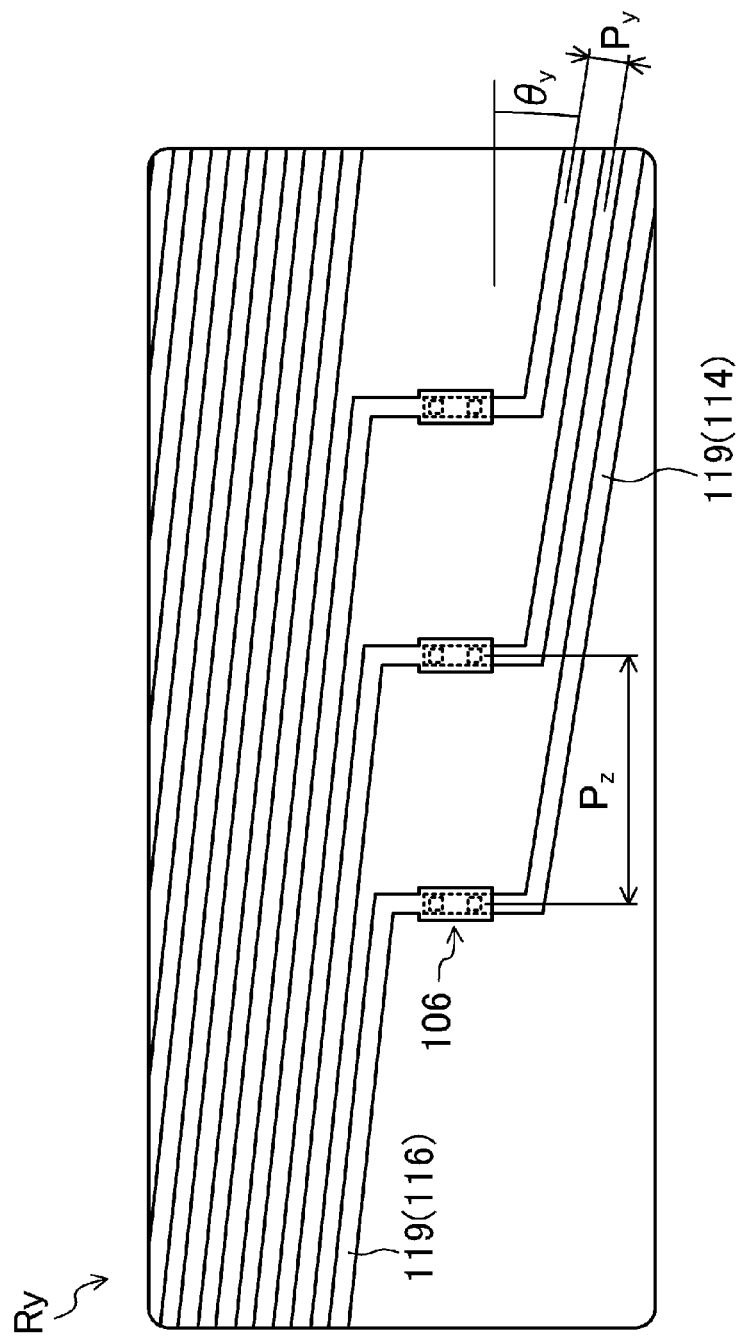
FIG. 17 is an enlarged plan view of a region Ry in FIG. 15.

Next, the configurations of a plurality of video signal lines 119 according to a comparative example of this embodiment will be specifically described. Here, FIG. 15 is a plan view of an active matrix substrate 120 of the comparative example. FIGS. 16 and 17 are enlarged plan views of regions Rx and Ry in FIG. 15.

A non-display region N of the active matrix substrate 120 outside a display region D thereof includes a plurality of video signal lines 119 as illustrated in FIG. 15.

As illustrated in FIGS. 15-17, the video signal lines 119 are symmetrically placed with respect to an axis A orthogonal to a central portion of an edge of the display region D (the lower edge Su in FIG. 15) to extend in parallel from near the display region D in a direction orthogonal to the edge of the display region D (the lower edge Su in FIG. 15) while being spaced at pitches $P_a$, then extend in parallel in a direction that intersects the edge of the display region D (the lower edge Su in FIG. 15) at an angle $\theta_x$, subsequently extend in parallel in the direction orthogonal to the edge of the display region D (the lower edge Su in FIG. 15), further extend in parallel in the direction that intersects the edge of the display region D (the lower edge Su in FIG. 15) at an angle $\theta_y$, and finally extend to a mounting region M in parallel in the direction orthogonal to the edge of the display region D (the lower edge Su in FIG. 15) while being spaced at pitches $P_b$ (not shown).

As illustrated in FIG. 17, the video signal lines 119 include a plurality of connectors 106 spaced at pitches $P_z$ and each connecting a first wiring layer 116 to a second wiring layer 114 along the direction orthogonal to the edge of the display region D (the lower edge Su in FIG. 15). The connectors 106 are in a one-to-one correspondence with the video signal lines 119. Here, the pitch $P_z$ between each adjacent pair of the connectors 106 is greater than the pitch $P_b$ between each adjacent pair of portions of the video signal lines 119 in the mounting region M and less than the pitch $P_a$ between each adjacent pair of portions of the video signal lines 119 near the display region D.

Here, when the line width of the first wiring layer 116 of each of the video signal lines 119 is 4 μm, and the distance between each adjacent pair of the first wiring layers 116 is 4 μm, the pitch $P_x$ between each adjacent pair of the video signal lines 119 (the first wiring layers 116) extending in a direction inclined at the angle θ is 8 μm. Thus, when the pitch $P_a$ is 75 μm, the angle θ is about 6.1° based on the relational expression $\sin \theta_x = P_x/P_a$. Assuming that the first and second wiring layers 116 and 114 are formed by photolithography using light-exposure apparatuses having substantially the same resolution, the pitch $P_y$ between each adjacent pair of the video signal lines 119 (the second wiring layers 114) extending in a direction inclined at the angle $\theta_y$ is 8 μm, which is equal to the pitch $P_x$. Furthermore, assuming that the pitch $P_z$ is 60 μm, the angle $\theta_y$ is about 7.7° based on the relational expression $\sin \theta_y = P_y/P_z$. Thus, since, in the active matrix substrate 120 of the comparative example, the video signal lines 119 do not form straight lines, an ending point of the outermost one of the video signal lines 119 is located relatively outward.

As described above, according to the active matrix substrate 20a of this embodiment and the liquid crystal display panel 50 including the same, in the non-display region N, the first signal lines 19a are symmetrically placed with respect to the axis A orthogonal to the central portion of the edge of the display region D to extend in parallel from near the display region D in the direction orthogonal to the edge of the display region D while being spaced at the pitches $P_a$, then extend in parallel in the direction that intersects the edge of the display region D at the angle $\theta_a$, and further extend to the mounting region M in parallel in the direction orthogonal to the edge of the display region D while being spaced at the pitches $P_b$. In the non-display region N, the second signal lines 19b adjacent to the first signal lines 19a in the reference directions Ca and Cb of the angle $\theta_a$ extend in parallel from near the display region D in the direction orthogonal to the edge of the display region D while being spaced at the pitches $P_a$, then extend in parallel in the direction that intersects the edge of the display region D at the angle $\theta_a$, subsequently extend in parallel in the direction orthogonal to the edge of the display region D, further extend in parallel in the direction that intersects the edge of the display region D at the angle $\theta_b$, and finally extend to the mounting region M in parallel in the direction orthogonal to the edge of the display region D while being spaced at the pitches $P_b$. The first connectors 6a are in a one-to-one correspondence with the first signal lines 19a, and are each configured to connect the first wiring layer 16b to the second wiring layer 14b along the direction orthogonal to the edge of the display region D. The second connectors 6b are in a one-to-one correspondence with the second signal lines 19b, and are each configured to connect the first wiring layer 16b to the second wiring layer 14b in the direction orthogonal to the edge of the display region D. The pitch $P_d$ between each adjacent pair of the second connectors 6b is greater than the pitch $P_c$ between each adjacent pair of the first connectors 6a. Here, increasing the pitch $P_d$ can reduce the angle $\theta_b$, based on the relational expression $\sin \theta_b = P_g/P_d$, where $P_g$ represents the pitch between each adjacent pair of portions of the side-by-side second signal lines 19b extending in parallel in the direction that intersects the edge of the display region D at the angle $\theta_b$. Since the pitch $P_d$ between each adjacent pair of the second connectors 6b located outward of the first connectors 6a is, therefore, greater than the pitch $P_c$ between each adjacent pair of the first connectors 6a located inwardly of the second connectors 6b, this can reduce the angle $\theta_b$, and increase the degree of concentration of the second signal lines 19b. This can reduce the increase in area where a group including the first and second signal lines 19a and 19b is routed, and therefore, even if the non-display region N includes the connectors 6 (the first and second connectors 6a and 6b) provided somewhere along the signal lines to change the signal lines from the first wiring layers 16b to the second wiring layers 14b, the increase in area where the signal lines are routed can be reduced. Furthermore, since the increase in area where the first and second signal lines 19a and 19b are routed can be reduced, an inexpensive small IC chip can be mounted on the mounting region M, and the non-display region N including the mounting region M can be reduced in size to provide a narrower picture-frame.

According to the active matrix substrate 20a of this embodiment and the liquid crystal display panel 50 including the same, the pitch $P_a$ between each adjacent pair of portions of the first and second signal lines 19a and 19b near the display region D is equal to the pitch $P_d$ between each adjacent pair of the second connectors 6b, and the pitch $P_b$ between each adjacent pair of portions of the first and second signal lines 19a and 19b near the mounting region M is equal to the pitch $P_c$ between each adjacent pair of the first connectors 6a. Thus, the angles $\theta_a$ and $\theta_b$ formed by the direction of extension of the second signal lines 19b are equal to each other, and the second signal lines 19b each extend in a substantially straight line. This can efficiently reduce the increase in area where the second signal lines 19b are routed.

Furthermore, according to the active matrix substrate 20a of this embodiment and the liquid crystal display panel 50 including the same, one of the first connectors 6a closest to the second connectors 6b and one of the second connectors 6b closest to the one of the first connectors 6a are spaced at the pitch $P_e$, and the pitch $P_e$ is greater than the pitch $P_c$ and less than the pitch $P_d$. This can provide a buffer region between a group of the first connectors 6a spaced at the pitches $P_c$ and a group of the second connectors 6b spaced at the pitches $P_d$. The buffer region is configured to eliminate layout disadvantages arising from the difference between the pitches.

Moreover, according to the active matrix substrate 20a of this embodiment and the liquid crystal display panel 50 including the same, the first and second connectors 6a and 6b are arranged along the edge of the display region D to overlap the side of the sealing material 45. This allows the side of the sealing material 45 to protect the first and second connectors 6a and 6b. Furthermore, in the active matrix substrate 20a, the first and second wiring layers 16b and 14b are both located under the protective insulating film 17 being in contact with the sealing material 45. Thus, even with a great difference between the thickness of each of the first wiring layers 16b and that of each of the second wiring layers 14b, the height of the surface of the protective insulating film 17 being in contact with the sealing material 45 is uniform. This can reduce variations in thickness of the liquid crystal layer 40, i.e., variations in cell thickness.

According to the active matrix substrate 20a of this embodiment and the liquid crystal display panel 50 including the same, the first and second signal lines 19a and 19b are symmetrically placed with respect to the axis A orthogonal to the central portion of the edge of the display region D. This reduces the length of each of the first and second signal lines 19a and 19b, and reduces the area where the first and second signal lines 19a and 19b are routed.

Second Embodiment of the Disclosure

Figure 11:
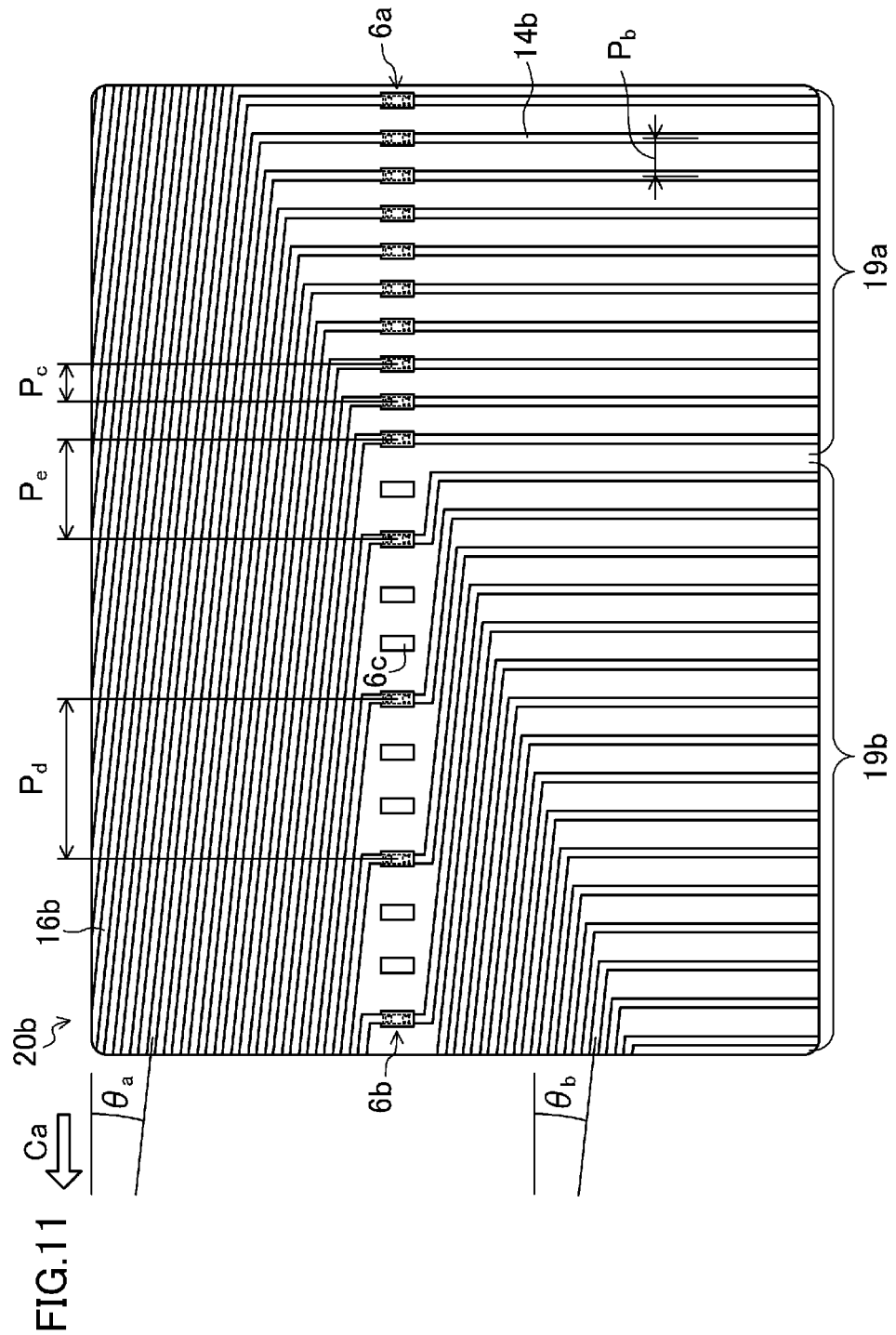
FIG. 11 is a plan view of an active matrix substrate according to a second embodiment.

FIG. 11 is a plan view of an active matrix substrate 20b of this embodiment corresponding to FIG. 7 described in the first embodiment. Here, in the following embodiments, the same characters as those in FIGS. 1-10 are used to represent equivalent components, and the detailed explanation thereof is omitted.

In the first embodiment, the active matrix substrate 20a that does not include electrode features between each adjacent pair of the second connectors 6b is exemplified. However, in this embodiment, the active matrix substrate 20b including a plurality of dummy electrode features 6c between each adjacent pair of second connectors 6b is exemplified.

As illustrated in FIG. 11, the configuration of the active matrix substrate 20b is identical with that of the active matrix substrate 20a except that a region of the active matrix substrate 20b corresponding to the region Rd of the active matrix substrate 20a of the first embodiment includes the island-like electrode features 6c arranged between each adjacent pair of the second connectors 6b along an edge of a display region D. Here, the electrode features 6c are made of a metal film forming first wiring layers 16b, a metal film forming second wiring layers 14b, or a stack of the metal films. While, in this embodiment, the rectangular electrode features 6c are exemplified, the electrode features 6c may be, for example, in the form of characters, such as alphanumeric characters indicating numbers attached to corresponding signal lines. Alternatively, one of the electrode features 6c forming a geometrical shape may be located every predetermined number of the electrode features 6c, such as every ten electrode features 6c.

As described above, similarly to the first embodiment, the active matrix substrate 20b of this embodiment can reduce the increase in area where a group including the first and second signal lines 19a and 19b is routed, and therefore, even if a non-display region N includes the connectors 6 (the first and second connectors 6a and 6b) provided somewhere along the signal lines to change the signal lines from the first wiring layers 16b to the second wiring layers 14b, the increase in area where the signal lines are routed can be reduced.

According to the active matrix substrate 20b of this embodiment, the electrode features 6c are provided between each adjacent pair of the second connectors 6b, thereby allowing the height of the surface of a protective insulating film 17 being in contact with a sealing material 45 to be more uniform.

Third Embodiment of the Disclosure

Figure 12:
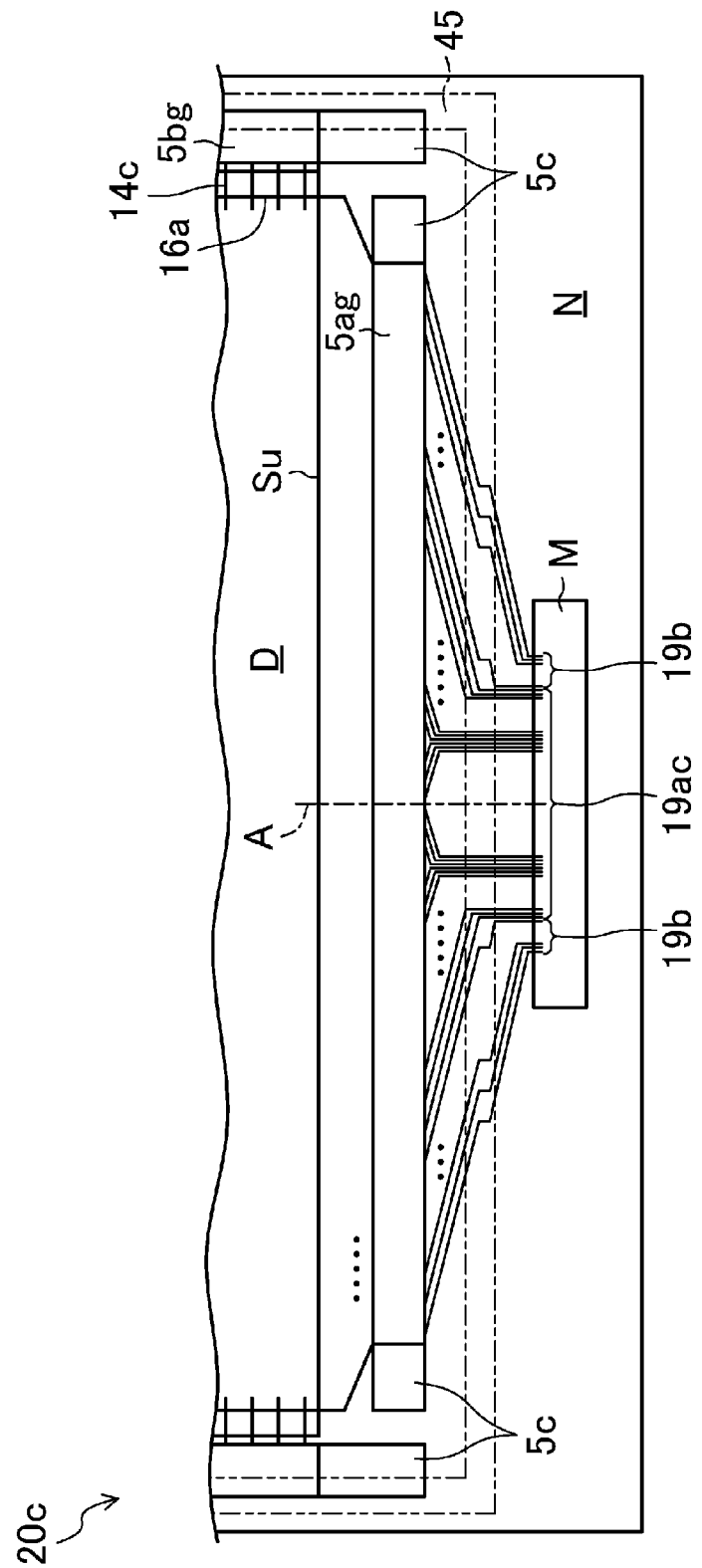
FIG. 12 is a plan view of an active matrix substrate according to a third embodiment.

FIG. 12 is a plan view of an active matrix substrate 20c of this embodiment corresponding to FIG. 3 described in the first embodiment.

In the first and second embodiments, the active matrix substrates 20a and 20b in each of which a group of portions of the first and second signal lines 19a in the mounting region M includes a terminal group are exemplified. However, in this embodiment, the active matrix substrate 20c in which a group of portions of a plurality of first signal lines 19ac and a plurality of second signal lines 19b in a mounting region M includes two terminal groups is exemplified.

As illustrated in FIG. 12, the configuration of the active matrix substrate 20c is identical with that of the active matrix substrate 20a of the first embodiment except that the active matrix substrate 20c has a non-display region N including the first signal lines 19ac.

As illustrated in FIG. 12, the first signal lines 19ac include a first line group and a second line group. The first line group includes lines symmetrically placed preferably with respect to an axis A orthogonal to a central portion of an edge of a display region D (the lower edge Su in FIG. 12) to extend in parallel from near the display region D in a direction orthogonal to the edge of the display region D (the lower edge Su in FIG. 12) while being spaced at pitches $P_a$, then extend in parallel in a direction that intersects the edge of the display region D (the lower edge Su in FIG. 12) at an angle $\theta_a$ (in a direction away from the axis A in FIG. 12), and further extend to the mounting region M in parallel in the direction orthogonal to the edge of the display region D (the lower edge Su in FIG. 12) while being spaced at pitches $P_b$. The second line group includes lines located laterally outward of the first line group, and symmetrically placed with respect to the axis A orthogonal to the central portion of the edge of the display region D (the lower edge Su in FIG. 12) to extend in parallel from near the display region D in the direction orthogonal to the edge of the display region D (the lower edge Su in FIG. 12) while being spaced at pitches $P_a$, then extend in parallel in the direction that intersects the edge of the display region D (the lower edge Su in FIG. 12) at the angle $\theta_a$ (in a direction toward the axis A), and further extend to the mounting region M in parallel in the direction orthogonal to the edge of the display region D (the lower edge Su in FIG. 12) while being spaced at pitches $P_b$.

As illustrated in FIG. 12, in the mounting region M, terminals of the first signal lines 19ac in the left portion of FIG. 12 and terminals of the second signal lines 19b in the left portion of FIG. 12 form a first terminal group, and terminals of the first signal lines 19ac in the right portion of FIG. 12 and terminals of the second signal lines 19b in the right portion of FIG. 12 form a second terminal group. Here, an IC chip may be mounted on a portion of the mounting region M corresponding to each of the first and second terminal groups.

When the shapes of the first and second wiring layers 16b and 14b formed through the fabrication method described in the first embodiment are changed, this allows the fabrication of the active matrix substrate 20c of this embodiment.

As described above, similarly to the first and second embodiments, the active matrix substrate 20c of this embodiment can reduce the increase in area where a group including the first and second signal lines 19a and 19b is routed, and therefore, even if the non-display region N includes connectors 6 (first and second connectors 6a and 6b) provided somewhere along the signal lines to change the signal lines from the first wiring layers 16b to the second wiring layers 14b, the increase in area where the signal lines are routed can be reduced.

Fourth Embodiment of the Invention

Figure 13:
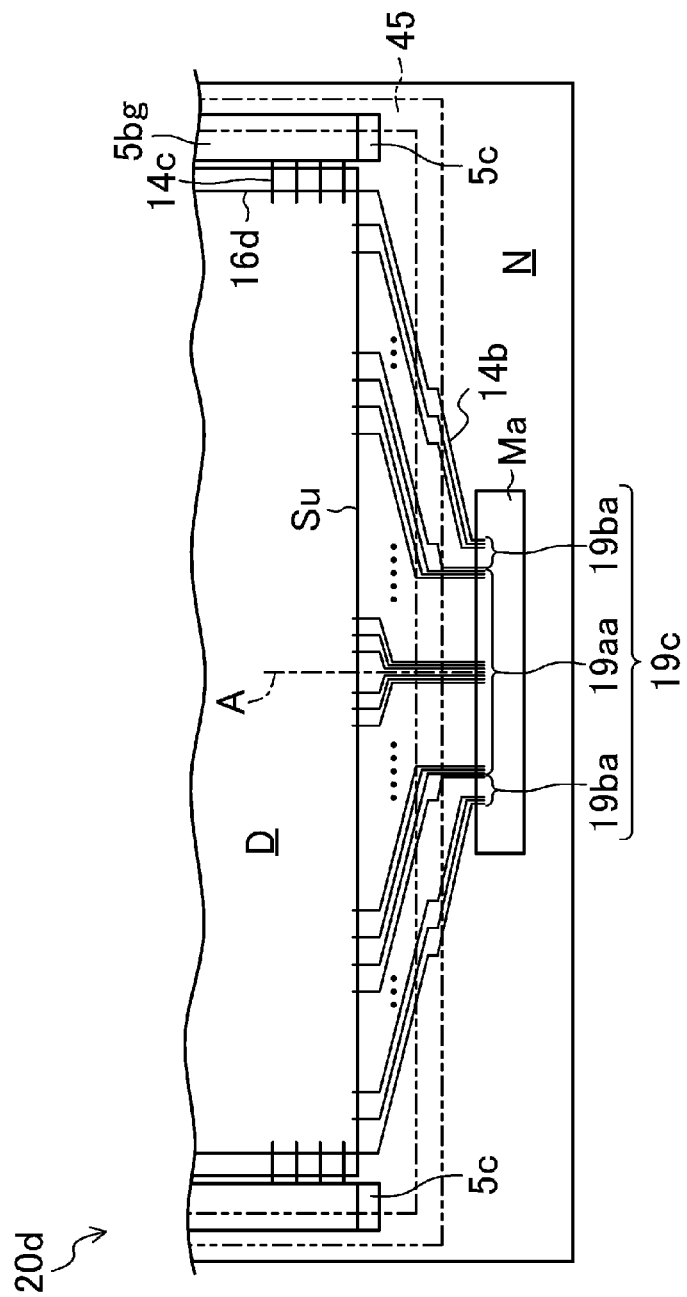
FIG. 13 is a plan view of an active matrix substrate according to a fourth embodiment.

FIG. 13 is a plan view of an active matrix substrate 20d of this embodiment corresponding to FIG. 3 described in the first embodiment.

In each of the above embodiments, the active matrix substrates 20a-20c each including the column control circuit 5ag between the source signal lines 16a and the mounting region M where an IC chip is mounted are exemplified. However, in this embodiment, the active matrix substrate 20d that does not include a column control circuit between source signal lines 16d and a mounting region Ma is exemplified.

As illustrated in FIG. 13, the configuration of the active matrix substrate 20d is identical with that of the active matrix substrate 20a of the first embodiment except that the active matrix substrate 20d includes a plurality of source signal lines 16d provided in its display region D to extend in parallel in a vertical direction in FIG. 13, and a plurality of video signal lines 19c provided in its non-display region N. The video signal lines 19c include first wiring layers 16d located in a portion of the non-display region N near the display region D, and second wiring layers 14b located in a portion of the non-display region N near a mounting region Ma of the active matrix substrate 20d. The first wiring layers 16d are each connected to a corresponding one of the second wiring layers 14b. Here, the first wiring layers 16d of the video signal lines 19c are extensions of the source signal lines 16d. While, in this embodiment, the configuration in which the first wiring layers 16d are the extensions of the source signal lines 16d is exemplified, the first wiring layers of the video signal lines 19c may be formed in a layer different from a layer including the source signal lines 16d, and may be made of a material different from that of the source signal lines 16d.

As illustrated in FIG. 13, the video signal lines 19c includes a plurality of first signal lines 19aa, and a plurality of second signal lines 19ba. The first signal lines 19aa are located inwardly of the second signal lines 19ba, and the second signal lines 19ba are located laterally outward of the first signal lines 19aa.

As illustrated in FIG. 13, the first signal lines 19aa are symmetrically placed preferably with respect to an axis A orthogonal to a central portion of an edge of the display region D (the lower edge Su in FIG. 13) to extend in parallel from near the display region D in a direction orthogonal to the edge of the display region D (the lower edge Su in FIG. 13) while being spaced at pitches $P_a$, then extend in parallel in a direction that intersects the edge of the display region D (the lower edge Su in FIG. 13) at an angle $\theta_a$, and further extend to the mounting region Ma in parallel in the direction orthogonal to the edge of the display region D (the lower edge Su in FIG. 13) while being spaced at pitches $P_b$.

The first signal lines 19aa include a plurality of first connectors (not shown) spaced at pitches $P_c$, and each connecting the first wiring layers 16d to the second wiring layers 14b along the direction orthogonal to the edge of the display region D (the lower edge Su in FIG. 13). The first connectors are in a one-to-one correspondence with the first signal lines 19aa. Here, the pitch $P_c$ between each adjacent pair of the first connectors is equal to the pitch $P_b$ between each adjacent pair of portions of the first signal lines 19aa in the mounting region Ma or between each adjacent pair of portions of the second signal lines 19ba therein.

As illustrated in FIG. 13, the second signal lines 19ba extend in parallel from near the display region D in the direction orthogonal to the edge of the display region D (the lower edge Su in FIG. 13) while being spaced at the pitches $P_a$, then extend in parallel in the direction that intersects the edge of the display region D (the lower edge Su in FIG. 13) at the angle $\theta_a$, subsequently extend in parallel in the direction orthogonal to the edge of the display region D (the lower edge Su in FIG. 13), further extend in parallel in the direction that intersects the edge of the display region D (the lower edge Su in FIG. 13) at an angle $\theta_b$, and finally extend to the mounting region Ma in parallel in the direction orthogonal to the edge of the display region D (the lower edge Su in FIG. 13) while being spaced at the pitches $P_b$.

The second signal lines 19ba include a plurality of second connectors (not shown) spaced at pitches $P_d$ greater than the pitch $P_c$, and each connecting the first wiring layers 16b to the second wiring layers 14b along the direction orthogonal to the edge of the display region D (the lower edge Su in FIG. 13). The second connectors are in a one-to-one correspondence with the second signal lines 19ba. Here, the pitch $P_d$ between each adjacent pair of the second connectors is equal to the pitch $P_a$ between each adjacent pair of portions of the first signal lines 19aa near the display region D or between each adjacent pair of portions of the second signal lines 19ba near the display region D.

When the shapes of the source signal lines 16a and the first wiring layers 16b formed through the fabrication method described in the first embodiment are changed, this allows the fabrication of the active matrix substrate 20d of this embodiment.

As described above, similarly to each of the embodiments, the active matrix substrate 20d of this embodiment can reduce the increase in area where a group including the first and second signal lines 19aa and 19ba is routed, and therefore, even if the non-display region N includes the connectors provided somewhere along the signal lines to change the signal lines from the first wiring layers 16b to the second wiring layers 14b, the increase in area where the signal lines are routed can be reduced.

Fifth Embodiment of the Disclosure

Figure 14:
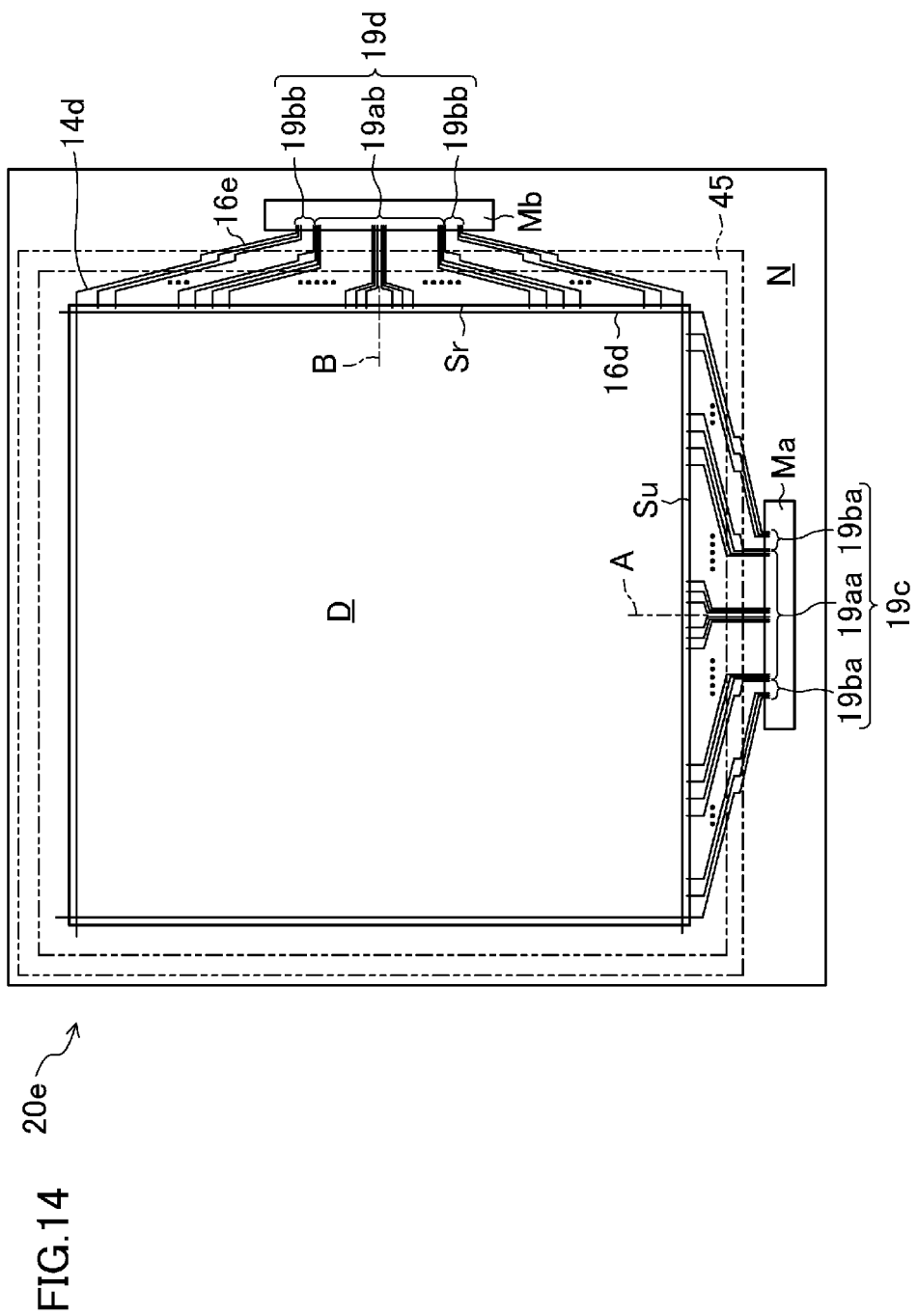
FIG. 14 is a plan view of an active matrix substrate according to a fifth embodiment.

FIG. 14 is a plan view of an active matrix substrate 20e of this embodiment.

In each of the above embodiments, the active matrix substrates 20a-20d in each of which only end portions of the source signal lines are routed are exemplified. However, in this embodiment, an active matrix substrate 20e in which end portions of gate signal lines are also routed is exemplified.

As illustrated in FIG. 14, the active matrix substrate 20e has a non-display region N including a mounting region Ma which is provided along an edge of a display region D of the active matrix substrate 20e (the lower edge Su in FIG. 14) to correspond to a central portion of the edge, and on which an IC chip configured to drive source signal lines 16d is mounted, and a mounting region Mb which is provided along another edge of the display region D (the right edge Sr in FIG. 14) to correspond to a central portion of the another edge, and on which an IC chip configured to drive gate signal lines 14d is mounted.

As illustrated in FIG. 14, the configuration of the active matrix substrate 20e is identical with that of the active matrix substrate 20d of the fourth embodiment except that the active matrix substrate 20e includes the gate signal lines 14d provided in the display region D to extend in parallel in a horizontal direction in FIG. 14, and a plurality of scanning signal lines 19d provided in the non-display region N. The scanning signal lines 19d include first wiring layers 14d near the display region D, and second wiring layers 16e near the mounting region Mb. The first wiring layers 14d are each connected to a corresponding one of the second wiring layers 16e. Here, the first wiring layers 14d of the scanning signal lines 19d are extensions of the gate signal lines 14d. While, in this embodiment, the configuration in which the first wiring layers 14d are the extensions of the gate signal lines 14d is exemplified, the first wiring layers of the scanning signal lines 19d may be formed in a layer different from a layer including the gate signal lines 14d, and may be made of a material different from that of the gate signal lines 14d.

As illustrated in FIG. 14, the scanning signal lines 19d include a plurality of first signal lines 19ab, and a plurality of second signal lines 19bb. The first signal lines 19ab are located inwardly of the second signal lines 19bb, and the second signal lines 19bb are located laterally outward of the first signal lines 19ab.

As illustrated in FIG. 14, the first signal lines 19ab are symmetrically placed preferably with respect to an axis B orthogonal to a central portion of the another edge of the display region D (the right edge Sr in FIG. 14) to extend in parallel from near the display region D in a direction orthogonal to the another edge of the display region D (the right edge Sr in FIG. 14) while being spaced at pitches $P_a$, then extend in parallel in a direction that intersects the another edge of the display region D (the right edge Sr in FIG. 14) at an angle $\theta_a$, and further extend to the mounting region Mb in parallel in the direction orthogonal to the another edge of the display region D (the right edge Sr in FIG. 3) while being spaced at pitches $P_b$.

The first signal lines 19ab include a plurality of first connectors (not shown) spaced at pitches $P_c$, and each connecting the first wiring layers 14d to the second wiring layers 16e along the direction orthogonal to the another edge of the display region D (the right edge Sr in FIG. 14). The first connectors are in a one-to-one correspondence with the first signal lines 19ab. Here, the pitch $P_c$ between each adjacent pair of the first connectors is equal to the pitch $P_b$ between each adjacent pair of portions of the first signal lines 19ab in the mounting region Mb or between each adjacent pair of portions of the second signal lines 19bb therein.

As illustrated in FIG. 14, the second signal lines 19bb extend in parallel from near the display region D in the direction orthogonal to the another edge of the display region D (the right edge Sr in FIG. 14) while being spaced at the pitches $P_a$, then extend in parallel in the direction that intersects the another edge of the display region D (the right edge Sr in FIG. 14) at the angle $\theta_a$, subsequently extend in parallel in the direction orthogonal to the another edge of the display region D (the right edge Sr in FIG. 14), further extend in parallel in the direction that intersects the another edge of the display region D (the right edge Sr in FIG. 14) at an angle $\theta_b$, and finally extend to the mounting region Mb in parallel in the direction orthogonal to the another edge of the display region D (the right edge Sr in FIG. 14) while being spaced at the pitches $P_b$.

The second signal lines 19bb include a plurality of second connectors (not shown) spaced at pitches $P_d$ greater than the pitch $P_c$, and each connecting the first wiring layers 14d to the second wiring layers 16e along the direction orthogonal to the another edge of the display region D (the right edge Sr in FIG. 14). The second connectors are in a one-to-one correspondence with the second signal lines 19bb. Here, the pitch $P_d$ between each adjacent pair of the second connectors is equal to the pitch $P_a$ between each adjacent pair of portions of the first signal lines 19ab near the display region D or between each adjacent pair of portions of the second signal lines 19bb near the display region D.

When the shapes of the gate signal lines 14c, the source signal lines 16a, and the first wiring layers 16b formed through the fabrication method described in the first embodiment are changed, this allows the fabrication of the active matrix substrate 20e of this embodiment.

As described above, similarly to the above embodiments, the active matrix substrate 20e of this embodiment can reduce the increase in area where a group including the first and second signal lines 19aa and 19ba toward a source and a group including the first and second signal lines 19ab and 19bb toward a gate are routed, and therefore, even if the non-display region N includes the connectors provided somewhere along corresponding ones of the signal lines to change the corresponding ones of the signal lines from the first wiring layers 16d to the second wiring layers 14b, or the connectors provided somewhere along corresponding ones of the signal lines to change the corresponding ones of the signal lines from the first wiring layers 14d to the second wiring layers 16e, the increase in area where the signal lines are routed can be reduced.

While, in each of the embodiments, a liquid crystal display panel is illustrated as a display panel, the present disclosure can be practiced also with other display panels, such as an organic electroluminescence (EL) display panel, an inorganic EL display panel, a plasma display panel, and electronic paper, and can be practiced with not only display panels for mobile applications, which panels need to be reduced in size, but also large screen display panels for monitors, such as televisions and digital signage.

While, in each of the embodiments, an active matrix substrate including, as a drain electrode, an electrode of a TFT connected to a pixel electrode is exemplified, the present disclosure can be practiced also with an active matrix substrate including, as a source electrode, an electrode of a TFT connected to a pixel electrode.

INDUSTRIAL APPLICABILITY

As described above, according to the present disclosure, even if connectors are provided somewhere along signal lines to change the signal lines from first wiring layers to second wiring layers, the increase in area where the signal lines are routed can be reduced. Thus, the present disclosure is useful for general wiring boards in which a group of a plurality of signal lines has a generally fan-shaped outline with one end narrowed.

DESCRIPTION OF REFERENCE CHARACTERS

A, B AXIS
D DISPLAY REGION
M, Ma, Mb MOUNTING REGION
N NON-DISPLAY REGION
5a TFT (SWITCH CIRCUIT)
6a FIRST CONNECTOR
6b SECOND CONNECTOR
14b SECOND WIRING LAYER
14d FIRST WIRING LAYER
16a, 16d SOURCE SIGNAL LINE (DISPLAY SIGNAL LINE)
16b, 16d FIRST WIRING LAYER
16e SECOND WIRING LAYER
19, 19c VIDEO SIGNAL LINE
19a, 19aa, 19ab, 19ac FIRST SIGNAL LINE
19b, 19ba, 19bb SECOND SIGNAL LINE
19d SCANNING SIGNAL LINE
20a-20e ACTIVE MATRIX SUBSTRATE
30 COUNTER SUBSTRATE
40 LIQUID CRYSTAL LAYER (DISPLAY MEDIUM LAYER)
45 SEALING MATERIAL
50 LIQUID CRYSTAL DISPLAY PANEL

The invention claimed is:

1. An active matrix substrate comprising:
a rectangular display region configured to display an image;
a non-display region defined around the rectangular display region;
a mounting region defined in a portion of the non-display region along an edge of the display region;
a plurality of first signal lines provided in the non-display region to extend in parallel from near the display region in a direction orthogonal to the edge of the display region while being spaced at a pitch $P_a$, then extend in parallel in a direction that intersects the edge of the display region at an angle $\theta_a$, and further extend to the mounting region in parallel in the direction orthogonal to the edge of the display region while being spaced at a pitch $P_b$;
a plurality of second signal lines provided in the non-display region to be adjacent to the first signal lines in a reference direction of the angle $\theta_a$, extend in parallel from near the display region in the direction orthogonal to the edge of the display region while being spaced at the pitch $P_a$, then extend in parallel in the direction that intersects the edge of the display region at the angle $\theta_a$, subsequently extend in parallel in the direction orthogonal to the edge of the display region, further extend in parallel in a direction that intersects the edge of the display region at an angle $\theta_b$, and finally extend to the mounting region in parallel in the direction orthogonal to the edge of the display region while being spaced at the pitch $P_b$;
a plurality of first wiring layers forming portions of the first and second signal lines near the display region;
a plurality of second wiring layers that form portions of the first and second signal lines near the mounting region, are formed in a layer different from a layer including the first wiring layers, and are made of a material different from that of the first wiring layers;
a plurality of first connectors that are provided in the non-display region so as to be spaced at a pitch $P_c$, and are included in the first signal lines to connect corresponding ones of the first wiring layers to corresponding ones of the second wiring layers along the direction orthogonal to the edge of the display region; and
a plurality of second connectors that are provided in the non-display region to be adjacent to the first connectors and so as to be spaced at a pitch $P_d$ greater than the pitch $P_c$, and are included in the second signal lines to connect corresponding ones of the first wiring layers to corresponding ones of the second wiring layers along the direction orthogonal to the edge of the display region.

2. The active matrix substrate of claim 1, wherein
the pitch $P_a$ is equal to the pitch $P_d$, and
the pitch $P_b$ is equal to the pitch $P_c$.

3. The active matrix substrate of claim 1, wherein
one of the first connectors closest to the second connectors and one of the second connectors closest to the first connectors are spaced at a pitch $P_e$, and
the pitch $P_e$ is greater than the pitch $P_c$ and less than the pitch $P_d$.

4. The active matrix substrate of claim 1, wherein
the first and second connectors are arranged along the edge of the display region.

5. The active matrix substrate of claim 1, wherein
the display region includes a plurality of source signal lines extending in parallel in the direction orthogonal to the edge of the display region, and
the first and second signal lines are a plurality of video signal lines each connected through a switch circuit to some of the source signal lines that are equal in number to colors forming a pixel.

6. The active matrix substrate of claim 1, wherein
the display region includes a plurality of display signal lines extending in parallel in the direction orthogonal to the edge of the display region, and
the first and second signal lines are each connected to a corresponding one of the display signal lines.

7. The active matrix substrate of claim 6, wherein
the display signal lines are source signal lines.

8. The active matrix substrate of claim 1, wherein
the mounting region is defined in a portion of the non-display region corresponding to a central portion of the edge of the display region,
the first signal lines are symmetrically placed with respect to an axis orthogonal to the central portion of the edge of the display region, and
the second signal lines are located laterally outward of the first signal lines.

9. A display panel comprising:
the active matrix substrate of claim 1;
a counter substrate facing the active matrix substrate; and
a display medium layer provided between the active matrix substrate and the counter substrate.

10. The display panel of claim 9, wherein
the display medium layer is a liquid crystal layer.

11. The display panel of claim 10, wherein
a frame-shaped sealing material is provided between the active matrix substrate and the counter substrate to enclose the liquid crystal layer, and
the first and second connectors overlap a side of the sealing material.

* * * * *